US005742209A

United States Patent [19]

Lemke et al.

[11] Patent Number: 5,742,209

[45] Date of Patent: Apr. 21, 1998

[54] FOUR CAVITY EFFICIENCY ENHANCED MAGNETICALLY INSULATED LINE OSCILLATOR

[75] Inventors: Raymond W. Lemke; Miles C. Clark; Steve E. Calico, all of Albuquerque, N. Mex.

[73] Assignee: The United States of America as represented by the United States Department of Energy, Washington, D.C.

[21] Appl. No.: 677,542

[22] Filed: Jul. 10, 1996

[51] Int. Cl.$^6$ .......... H03B 9/08

[52] U.S. Cl. .......... 331/82; 315/3.6; 315/39.3; 331/83

[58] Field of Search .......... 331/79, 81, 82, 331/83; 315/3.5, 3.6, 39, 39.3

[56] References Cited

U.S. PATENT DOCUMENTS

| | | | |
|---|---|---|---|
| 4,785,261 | 11/1988 | Bacon et al. | 331/82 |
| 5,302,881 | 4/1994 | O'Loughlin | 315/111.21 |

OTHER PUBLICATIONS

M. Clark et al., "Magnetically Insulated Transmission Line Oscillator," Appl. Phys. Lett., vol. 52, No. 1, Jan. 4, 1988.
B. Marder, "Simulated Behavior of the Magnetically Insulated Oscillator," J. Appl. Phys., vol. 65, No. 3, Feb. 1, 1989.
C. Mendel et al., "Experiments on a Current–Toggled Plasma–Opening Switch," J. Appl. Phys., vol. 71, No. 8, Apr. 15, 1992.

*Primary Examiner*—Siegfried H. Grimm
*Attorney, Agent, or Firm*—Luis M. Ortiz; James H. Chafin; William R. Moser

[57] ABSTRACT

A four cavity, efficient magnetically insulated line oscillator (C4-E MILO) having seven vanes and six cavities formed within a tube-like structure surrounding a cathode. The C4-E MILO has a primary slow wave structure which is comprised of four vanes and the four cavities located near a microwave exit end of the tube-like structure. The primary slow wave structure is the four cavity (C4) portion of the magnetically insulated line oscillator (MILO). An RF choke is provided which is comprised of three of the vanes and two of the cavities. The RF choke is located near a pulsed power source portion of the tube-like structure surrounding the cathode. The RF choke increases feedback in the primary slow wave structure, prevents microwaves generated in the primary slow wave structure from propagating towards the pulsed power source and modifies downstream electron current so as to enhance microwave power generation. A beam dump/extractor is located at the exit end of the oscillator tube for extracting microwave power from the oscillator, and in conjunction with an RF extractor vane, which comprises the fourth vane of the primary slow wave structure (nearest the exit) having a larger gap radius than the other vanes of the primary SWS, comprises an RF extractor. Uninsulated electron flow is returned downstream towards the exit along an anode/beam dump region located between the beam dump/extractor and the exit where the RF is radiated at said RF extractor vane located near the exit and the uninsulated electron flow is disposed at the beam dump/extractor.

9 Claims, 19 Drawing Sheets

FOUR CAVITY EFFICIENCY ENHANCED MAGNETICALLY INSULATED LINE OSCILLATOR

The United States Government has rights in this invention pursuant to contract No. DE-AC04-94DP85000 between Sandia Corporation and the United States Department of Energy.

FIELD OF THE INVENTION

This invention relates to magnetically insulated line oscillators (MILOs), and more particularly to a four cavity MILO that is ultra compact and displays enhanced efficiency as a result of the four cavity configuration that incorporates an RF choke and electron dump region to obtain high power microwaves with lower voltage requirements than typically required in the microwave field for gigawatt output from microwave sources.

BACKGROUND OF THE INVENTION

Magnetically insulated transmission line oscillators (MILOs) have been shown to produce very high-power microwave pulses. The MILO concept is based on the relativistic flow of electrons in a magnetically insulated transmission line on which a slow wave structure, typically thin metal vanes, has been imposed. Its geometry has typically been similar to that of a linear magnetron or crossed-field amplifier. In the MILO, however, the magnetic field which insulates the diode is produced by the electron flow itself rather than being imposed by external coils. This eliminates the need to match the applied voltage to the magnetic field. Because both the insulating magnetic field and accelerating voltage are produced by the same source, the device can be run at high voltages without electrical breakdown.

Several configurations for MILOs have been proposed. In a paper by Clark et al., published in Applied Physics Letters (Jan. 4, 1988), entitled "Magnetically Insulated Transmission Line Oscillator", three MILO geometries were being investigated: planar (FIG. 1*a*), coaxial (FIG. 1*b*), and concentric (FIG. *c*). An inverted coaxial geometry in which the vanes are on the inside and the outer cylinder is the cathode has also been studied. In its basic operation, electrons, represented by dots in FIGS. 2*b*–2*d*, are expelled from the cathode via field emission and flow freely upward across the gap. FIG. 2(*a*) illustrates the MILO geometry where the cathode is on the bottom, and power enters from the lower left of the MILO. FIG. 2(*b*) shows the device just after the bias voltage is applied. The magnetic field produced by the current causes the flow to bend away from the anode as seen in FIG. 2(*c*), resulting in a stream of electrons flowing to the right which interacts with the slow wave structure to produce electromagnetic oscillations. FIG. 2(*d*) illustrates an electron spoke formation associated with microwave generation in the cavities of the MILO. The fundamental difference between the MILO and the magnetron or CFA is that the magnetic field which insulates the high voltage gap is produced in the MILO by the electron flow itself rather than being imposed by external coils. This has resulted in considerable simplification and eliminated the need to fine tune the magnetic field to match the applied voltage. The self-generated magnetic field continuously adjusts to fluctuations in the voltage. It also permits a large interaction volume useful for keeping power densities down.

A paper by B.M. Marder entitled "Simulated Behavior of the Magnetically Insulated Oscillator", J. Appl. Phys. 65 (3), Feb. 1, 1989, identifies the main parameters characterizing a MILO as: G, the anode-cathode gap; D, the depth of the cavities; S, the periodic spacing of the vanes; W, the width of the vanes; N, the number of cavities; V, the applied voltage; $Z_L$, the load impedance; and R, the radius of a coaxial or concentric device. MILO operation also depends on the region of electron emission and on power extraction from the cavities. The MILO illustrated in FIGS. 2*a*–2*d* can represent either a planar geometry, in which the device extends infinitely far into and out of the figure plane, a coaxial device in which a centerline lies below the figure, or a concentric design in which the centerline lies to the left of the figure. Both coaxial and centerline geometries also allow an inverted configuration in which the centerline lies on the other side.

The problem with the MILOs presented by Clark and Marder is that microwaves generated within the slow wave structure of the MILO tend to propagate upstream towards the pulsed power system and return out of phase with the oscillating tube resulting in interference with the generation of outbound microwaves.

Another problem with prior MILO designs is that efficient microwave extraction is not accomplished because uninsulated electron flow which tends to flow towards the load end of the MILO will tend to interfere with the microwaves exiting the microwave extraction region of the MILO located near the load end of the device.

Yet another problem with prior MILO designs is that full efficiency cannot be accomplished until operation of the device approaches a pure π mode where fields in adjacent cavities are 180 degrees out of phase. Operation in the π mode provides control over the spatial harmonics involved in wave oscillation. A MILO consisting of more than 4 cavities in the primary slow wave structure runs in a combination of spatial harmonics that interact less efficiently with the electron flow.

Thus it is an object of the invention to provide an improved MILO that is compact and efficient in microwave generation.

It is another object of this invention to provide a MILO that will prevent microwaves generated in the primary slow wave structure from propagating upstream toward the pulsed power system resulting in the interference of microwave generation.

It is yet another object of the invention to provide a MILO that will allow for the disposition of return current that accumulates downstream near the load where microwaves are being extracted, therefore eliminating interference with exiting microwaves.

It is yet another object of the invention to achieve an optimum emission region through design of the vanes within the MILO in order to achieve as much as 100% extraction efficiency from the MILO.

SUMMARY OF INVENTION

To achieve the foregoing and other objects, and in accordance with the purposes of the present invention as described herein, an improved MILO design is now presented. The inventors refer to this novel advancement in MILO technology as an ultra compact, 4-cavity, efficiency enhanced magnetically insulated transmission line oscillator ("C4-E MILO") because the design presented herein provides a compact, high power microwave tube that is based on earlier MILO technology. Using axial extraction, the invention solves the problem of generating and radiating gigawatt (GW) level microwave pulses with enhanced efficiency from a crossed-field microwave tube in which the insulating magnetic field is provided by the electron current that flows across the anode-cathode (A-K) gap. This is accomplished through several novel modifications to the original MILO tube discussed by the above referenced Clark and Marden publications. The invention differs from prior MILO technology because of its incorporation of an improved slow wave structure (SWS), RF choke, operation in a pure $\pi$ mode, beam dump/extractor geometry, RF extractor vane, and optimum emission region.

In summary, the SWS of the invention is comprised of 6 RF cavities and 7 vanes that form two distinct structures; an RF choke and the primary SWS. The primary SWS is essentially a 4 cavity MILO. Electron emission is allowed under the primary SWS only, which is where microwave generation takes place. The RF choke is provided to increase (enhance) feedback in the primary SWS and does not participate directly in the microwave generation process. Thus, the 4 cavity primary SWS represents a MILO-like tube whose performance is enhanced by the RF choke. The first 3 vanes of the SWS comprise the RF choke which is designed with longer vanes to prevent microwaves generated in the primary SWS from propagating upstream toward the pulsed power system, and returning out of phase within the oscillating tube. Microwaves that enter the choke region are damped which is critical for controlling tube performance. The beam dump/extractor geometry located at the load end of the MILO solves the problem of efficiently extracting microwave power from the MILO. Uninsulated electron flow is returned (dumped) downstream along the anode/beam dump region from where RF is radiated at the RF extractor vane. The last vane is the RF extractor vane which, in conjunction with the horizontal wall of the beam dump comprises the RF extractor. Because the radius of the last vane is equal to the outer radius of the beam dump wall, an efficient impedance match of extractor gap to coaxial transmission line occurs when the radius of the extractor vane is equal to the outer radius of the beam dump wall. Finally, the proper length of the emitting cathode is chosen to provide an optimum emission region to ensure the strongest coupling of electrons to the RF electric field generated in the primary SWS.

The improvements to the traditional MILO described herein, specifically the combination of a RF choke, beam dump, and RF extractor, results in a new tube that is 1 to 2 orders of magnitude more efficient than the original MILO, and which can consistently radiate gigawatt level microwave pulses at an applied voltage and impedance of, for example, 500 kV and 8.5 Ohms given the examples provided herein.

Still other objects of the present invention will become readily apparent to those skilled in this art from the following detailed description wherein the preferred embodiment of the invention is described. The invention will be set forth in part in the description that follows and in part will become apparent to those so skilled in the art upon examination of the following description or may be learned by practice of the invention. Accordingly, the drawings and description will be regarded as illustrative in nature and not as restrictive.

BRIEF DESCRIPTION OF THE DRAWINGS

The accompanying drawings incorporated in and forming part of the specification illustrate the present invention, and together with the description serve to explain the principles of the invention.

DETAILED DESCRIPTION OF THE INVENTION

Figure 1A:
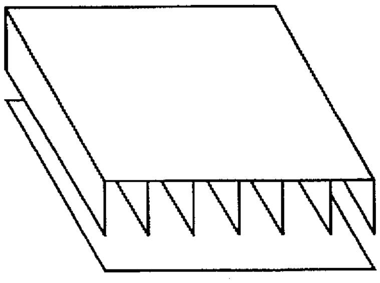
FIGS. 1*a*–1*c* illustrate three prior art MILO configurations.
Figure 1B:
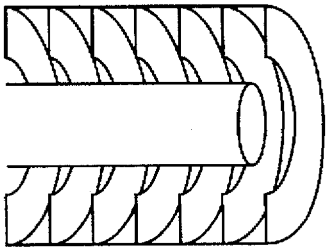
Figure 1C:
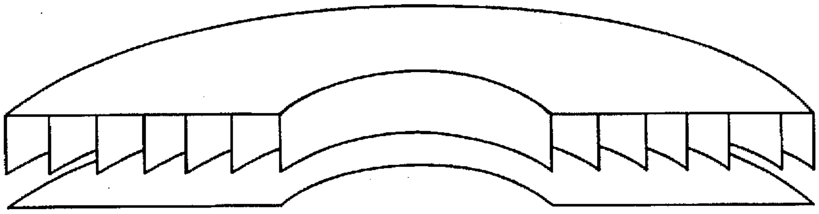
Figure 1c Prior Art
Figure 2A:
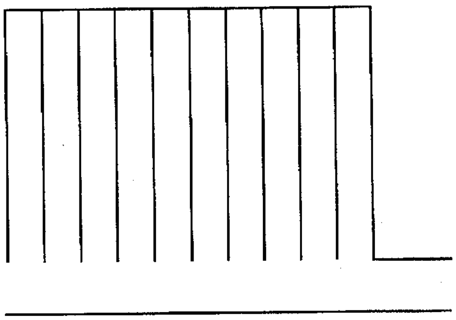
FIGS. 2*a*–2*d* illustrate a cross section half view of a prior art coaxial MILO configuration during operation.
Figure 2B:
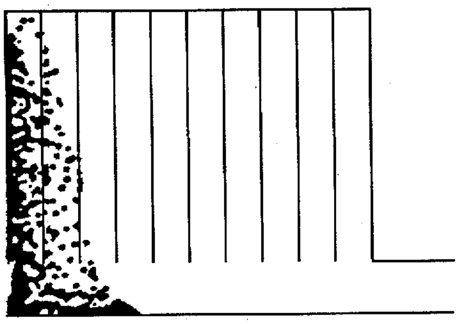
Figure 2C:
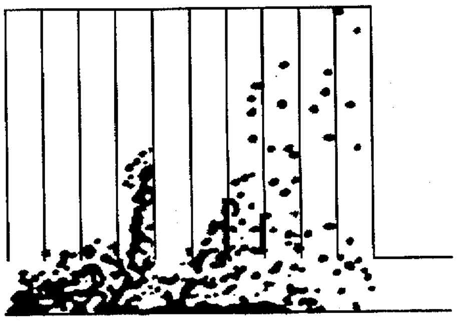
Figure 2D:
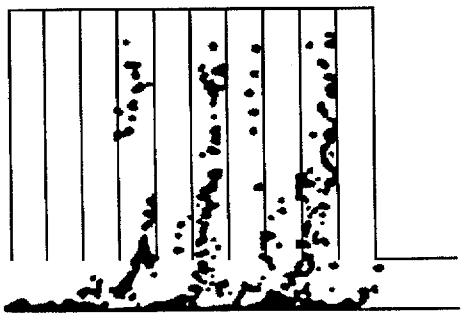
Figure 2d Prior Art
Figure 3:
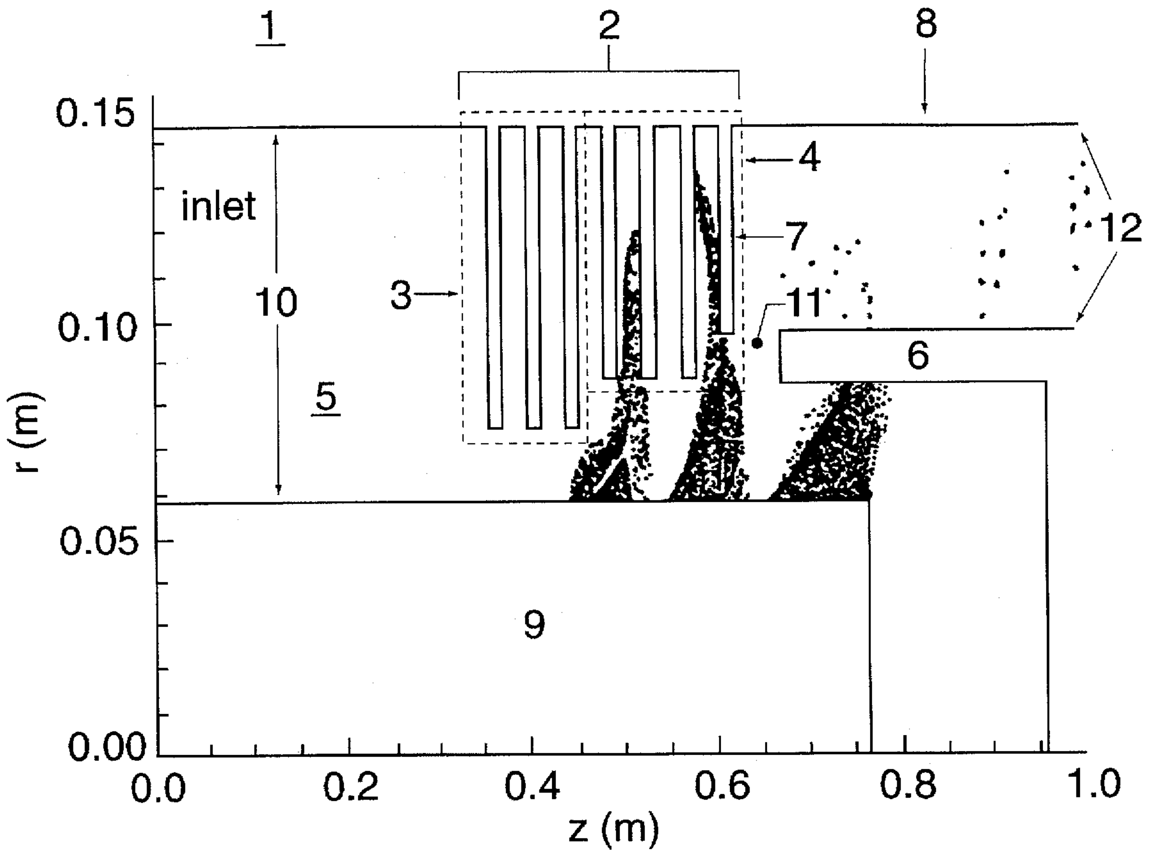
FIG. 3 illustrates a cross section half view of the 4 cavity MILO of the present invention.

Referring to FIG. 3, the geometry of the MILO 1 of the present invention is illustrated. In summary, the SWS portion 2 of the invention is comprised of 6 RF cavities and 7 vanes that form two distinct structures; an RF choke 3 and the primary SWS 4, which are bounded by dashed boxes in FIG. 3. The primary SWS 4 is essentially a four cavity MILO. As is shown in FIG. 3, electron emission is allowed under the primary SWS 4 only, which is where microwave generation takes place. The RF choke 3 is designed to increase (enhance) feedback in the primary SWS 4 and does not participate directly in the microwave generation process. Thus, the four cavity primary SWS 4 represents a MILO-like tube whose performance is enhanced by the RF choke 3. The first 3 vanes of the SWS 2 (looking from left to right in FIG. 3) comprises the RF choke 3 which is designed with longer vanes than the primary SWS 4 in order to prevent microwaves generated in the primary SWS 4, represented by the last four vanes of the SWS portion 2, from propagating upstream (to the left of FIG. 3) toward the pulsed power system (not shown), and returning out of phase within the oscillating tube 5. Microwaves that enter the RF choke 3 region are completely reflected back into the primary SWS 4 which is critical for controlling tube performance. The beam dump 6/RF extractor 7 geometry located at the load end of the MILO solves the problem of efficiently extracting microwave power from the MILO 1. Uninsulated electron flow is returned (dumped) downstream along the anode 8/beam dump 6 region from where RF is radiated at the RF extractor vane 7. The last vane is the RF extractor vane 7 which, in conjunction with the horizontal wall of the beam dump comprise the RF extractor. Because the radius of the last vane is equal to the outer radius of the beam dump wall, an efficient impedance match of extractor gap to coaxial transmission line occurs when the radius of the extractor vane is equal to the outer radius of the beam dump wall. Finally, the proper length of the emitting cathode 9 is chosen to provide an optimum emission region to ensure the strongest coupling of electrons to the RF electric field generated in the primary SWS 4.

A source of pulsed power (to the left of the inlet tube 5 in FIG. 3) generates a voltage across the A-K gap 10. The high voltage causes electrons to be emitted from the cathode 9 surface. Initially, before microwaves are generated, the magnetic field associated with the current flowing across the A-K gap 10 in the beam dump 6 region causes electrons in the primary SWS 4 to flow parallel to the cathode 9 axis. These electrons transfer energy to an electromagnetic wave whose characteristics are determined by the dimensions of the primary SWS 4. As a result of this energy transfer the power in the electromagnetic wave increases. Conversions of electron energy into microwave power continues until the electron flow is sufficiently modified by the RF fields that electron energy loss is balanced by electron energy gained, which is the situation illustrated in FIG. 3.

Microwave power is radiated through an aperture 11 (extractor gap) formed by the last vane of the primary SWS 4 and the horizontal wall of the beam dump 6 and through an outlet area 12 to an antennae (not shown). The extractor gap 11 is electromagnetically coupled to the last cavity of the SWS (a change is the RF voltage across the last cavity changes the radiated power). Making the radius of the last vane 7 slightly larger than the rest results in a better impedance match (more output power) to the coaxial line that transmits the radiated RF to an antenna (not shown). This is true regardless of the thickness of the beam dump 6 wall. For the particular geometry shown in FIG. 3, the best impedance match occurs when the outer radius of the beam dump 6 is equal to the radius of the last vane 7. This condition does not hold for a thick wall (≧2 cm).

For purposes of fully explaining the structure and operation of the invention, the improved MILO has been optimized using computer simulations to yield maximum radiated RF output power while maintaining a reasonably large A-K gap 10 to minimize impedance collapse. The following dimensions are not meant to limit the scope of the invention or the claims presented hereafter. Tube dimensions are: (1) the first three vanes have a radii of 7.55 cm and are 0.96 cm wide; the next 3 have radii of 8.6 cm and are 1.28 cm wide; the last vane has a radius of 9.65 cm and is 1.28 cm wide, (2) the SWS period (vane separation) is 4.16 cm, (3) the cathode radius is 5.75 cm, (4) the outer wall radius is 14.3 cm, (5) the inner and outer radii of the beam dump are 8.6 cm and 9.65 cm, respectively, and (6) the cathode length to the right of the downstream end of the extractor gap is 8.96 cm, which was calculated for V=500 kV using the following equation (Eq. 1):

$$L = 1.6 \frac{d^2}{r_c \ln\left(\frac{r_a}{r_c}\right)} \frac{(\gamma_a+1)^{\frac{1}{2}}}{(\gamma_a-1)}, \tag{1}$$

where $r_a$ and $r_c$ are the anode and cathode radii, respectively, d is the width of the A-K gap, and $\gamma_a$ represents the relativistic factor, which is related to the applied voltage V by the following expression:

$$V=511(\gamma_a-1), \tag{2}$$

which gives V in kilovolts. The expression for L is derived by requiring that the current emitted in the length of the cathode extending beyond the extractor gap be just equal to the minimum current necessary to insulate the electron flow under the primary SWS. The different vane thickness used for the choke and the primary SWS are not significant because similar results are obtainable for uniform thickness vanes.

Figure 4A:
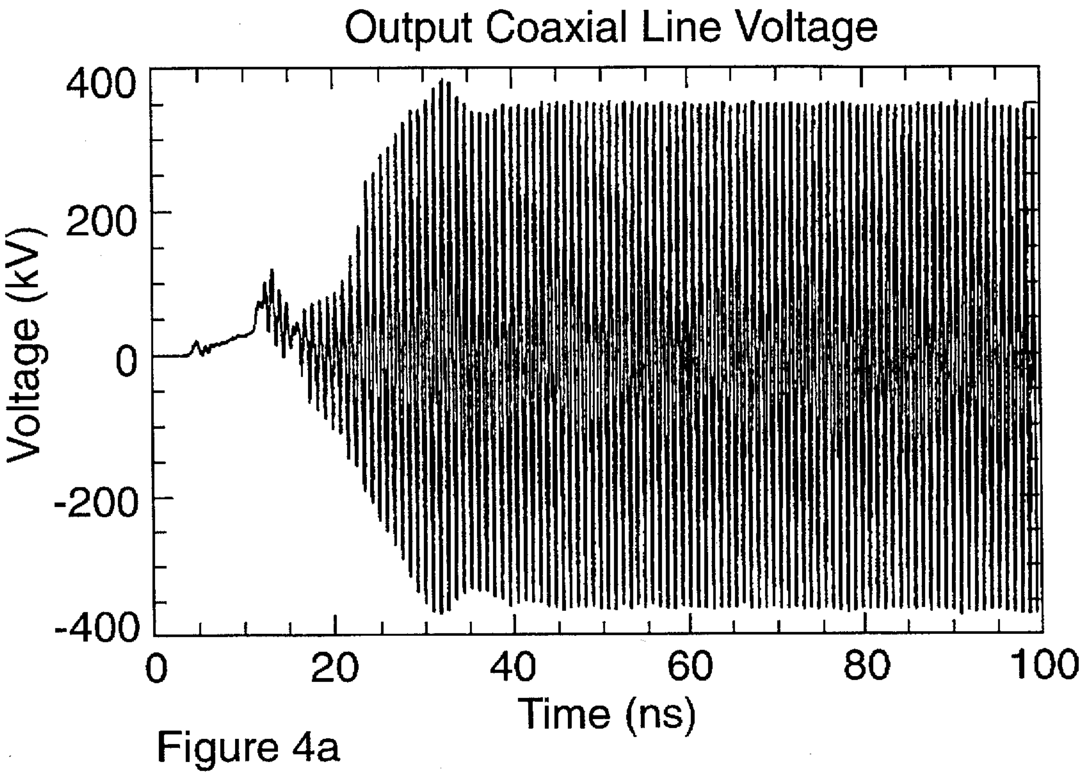
FIGS. 4*a* and 4*b* graphically illustrate voltage (FIG. 4*a*) and corresponding frequency spectrum (FIG. 4*b*) at the outlet for the invention.
Figure 4B:
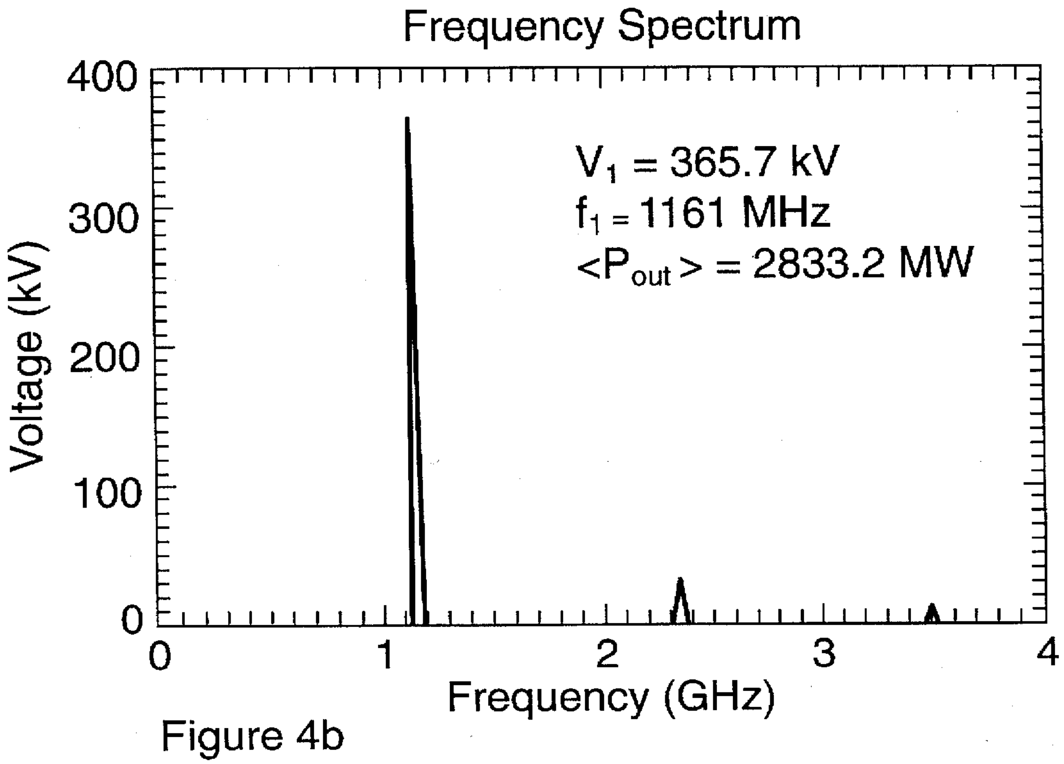

The RF voltage and corresponding frequency spectrum at the outlet are shown in FIGS. 4*a* and 4*b*. The associated average output power, the quantity measured in experiments, is calculated using the following expression:

$$P_{out} = \frac{V_1^2}{2Z}, \tag{3}$$

where Z=23.6 ohms is the impedance of the output coaxial line, and $V_1$ is the amplitude of the RF voltage at the frequency of oscillation (1161 MHz). Thus, for $V_1$=365.7 kV the radiated output power is 2833 MW,. Note that the oscillation frequency of the C4-E MILO is approximately the average of the π mode frequency for each section (choke and primary SWS).

The tube efficiency relative to the total input power of 27,707 MW is 10.2%. A large conversion efficiency can be attributed to a combination of RF choke, the fact that the primary SWS is comprised of 4 cavities, and the beam dump. Each of these elements is designed to produce an increase in the strength of the interaction between the electromagnetic wave and the electron flow, thereby increasing the conversion efficiency.

The RF choke has multiple effects. As mentioned above, the RF choke is designed to prevent radiation from escaping the upstream end of the tube by reflecting it back into the interaction region. This increases the RF voltage across the downstream vanes, which in turn strengthens the coupling to the electron flow. In addition, the impedance difference between the last choke vane and the first primary vane (the fourth vane in FIG. 3) causes the electron flow in the primary SWS to move closer to the cavity openings where the RF voltage is strongest, which also increases the conversion efficiency. A tube with an RF choke runs at lower impedance (the choke vanes are closer to the cathode than the primary vanes) than a tube without a choke. At lower impedance there is more current in the electron flow, and therefore, more power available for microwave generation.

The RF choke has a dramatic effect on tube operation. Numerical simulations show that the output power may decrease by a factor of 2 or more when the choke is removed, or the tube may not run at all. These results have been confirmed in experiments.

The oscillation phase (i.e., the phase between voltages across adjacent cavities) of a MILO depends on the number of cavities in the SWS. Simulations show that the C4-E MILO oscillates in the π mode, which is due to the fact that the primary SWS is comprised of four cavities. The π mode is the highest Q (quality factor) spatial harmonic associated with the SWS. Simulations show that the field distribution associated with the π mode produces the strongest coupling to the electron flow. A tube with more than four cavities tends to operate in a mode comprised of multiple harmonics, which do not couple to the electron flow as efficiently as the π mode.

The conversion efficiency is increased further by setting the length of the cathode that extends beyond the downstream end of the extractor gap according to Eq. 1. This causes the load current to flow to the dump just beyond the extractor gap. This provides a well defined RF boundary because microwaves are partially reflected off the load current (due to its high density) back into the primary SWS, thereby increasing feedback. The cathode length can be adjusted with minimal RF interaction which increases the conversion efficiency. Note that the cathode length can be adjusted with minimal RF effects only in the case of π mode operation because negligible RF is radiated into the beam dump region. In modes of oscillations that are comprised of propagating space harmonics, a small amount of RF is radiated into the beam dump where it forms a standing wave. In this case the length of the cathode in this region must be chosen to maximize the electric field at the extractor gap.

Figure 5:
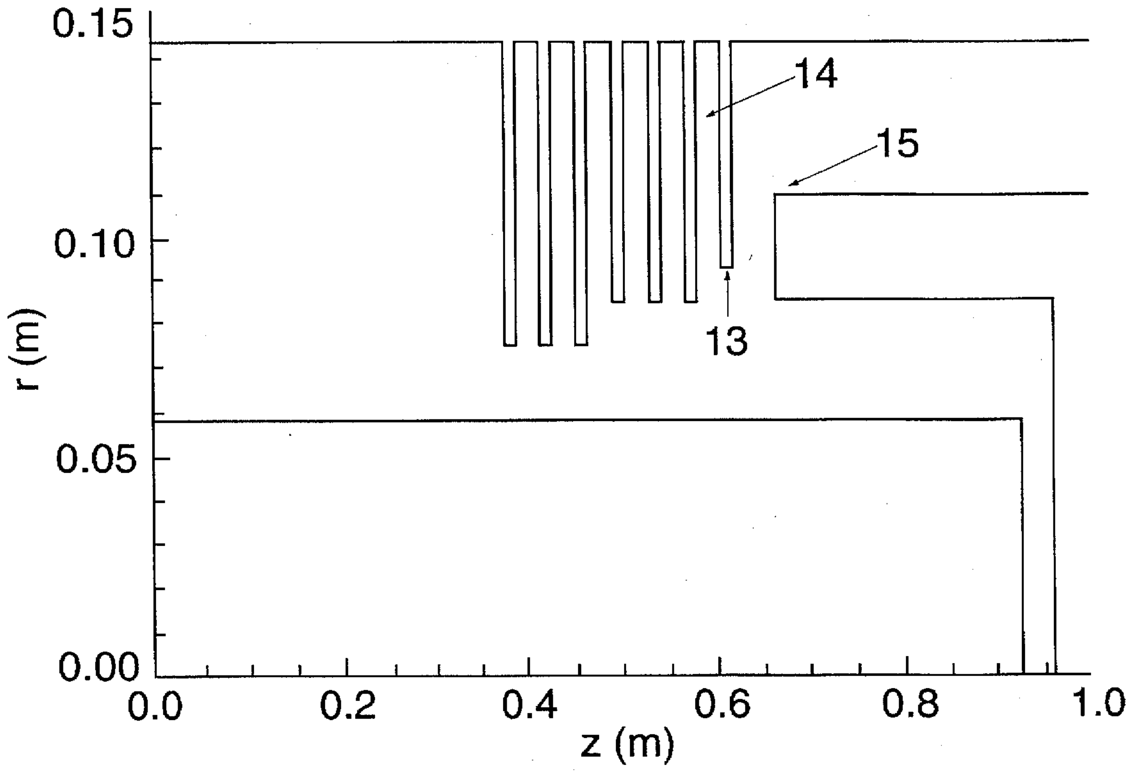
FIG. 5 illustrates an experimental version of the invention.

The utility of most of the improvements to the MILO discussed above have been demonstrated using an experimental version of the C4-E MILO, which is depicted in FIG. 5. Most of the experimental tube is identical to the optimized tube discussed above with the following exceptions: (1) the radius of the extractor vane 13 is 9.2 cm, (2) the vane spacing 14 (period of SWS) is 3.84 cm, and (3) the outer radius of the beam dump 15 is 10.85 cm.

Figure 6A:
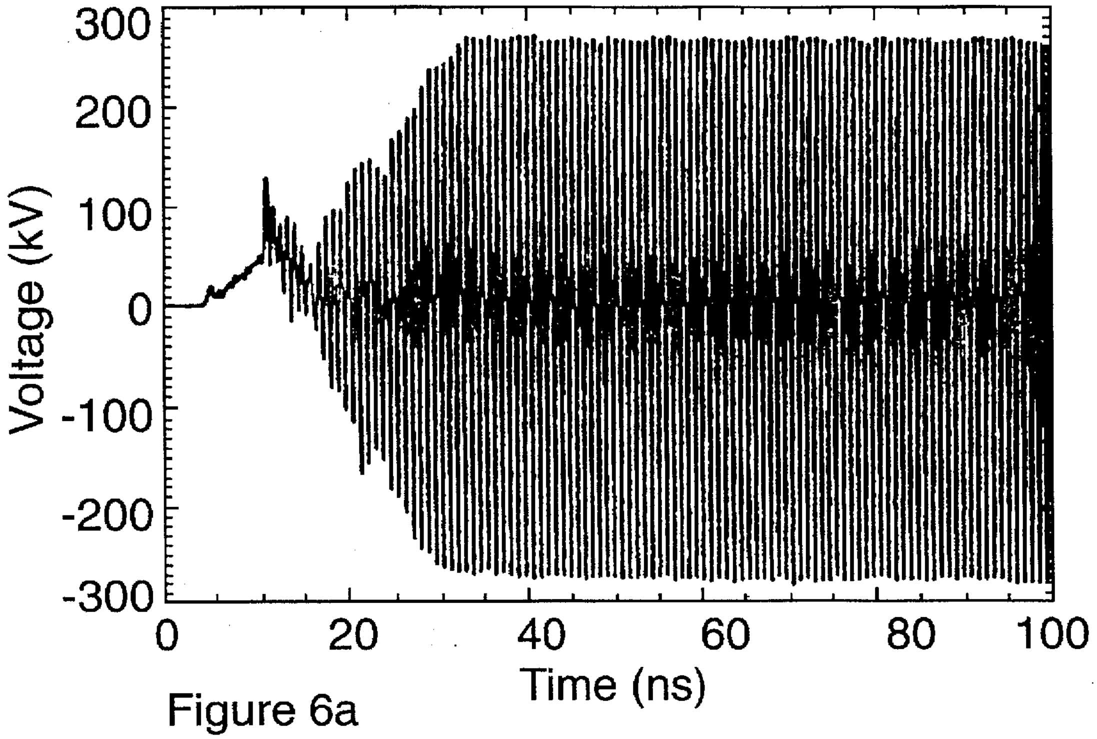
FIGS. 6*a* and 6*b* illustrate numerical simulations for an operating voltage of 272 kV that yields 2232 MW of radiated RF power at an oscillation frequency of 1183 MHz.
Figure 6B:
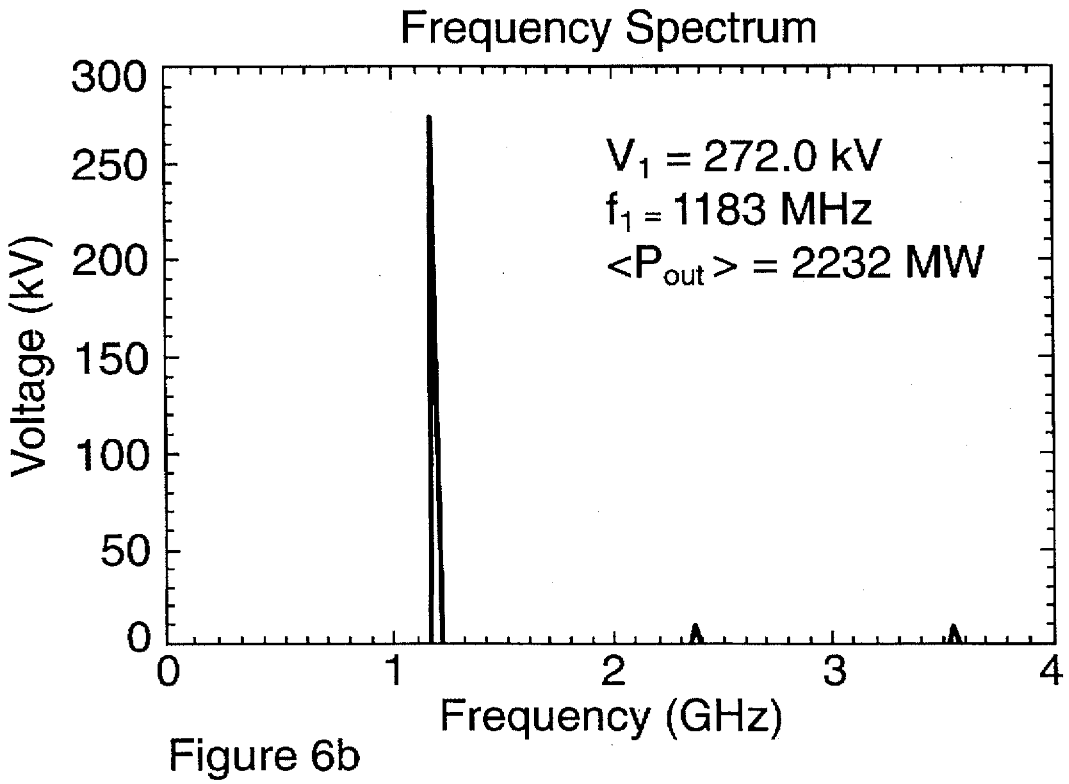

As shown in FIGS. 6*a* and 6*b*, numerical simulations predict that for an operating voltage of 272 kV the experimental C4-E MILO yields 2232 MW of radiated RF power at an oscillation frequency of 1183 MHz. The operating impedance is 8.4 ohms, which implies an input power of 29,489 MW. Thus the output power corresponds to an efficiency of 7.6%.

Figure 7A:
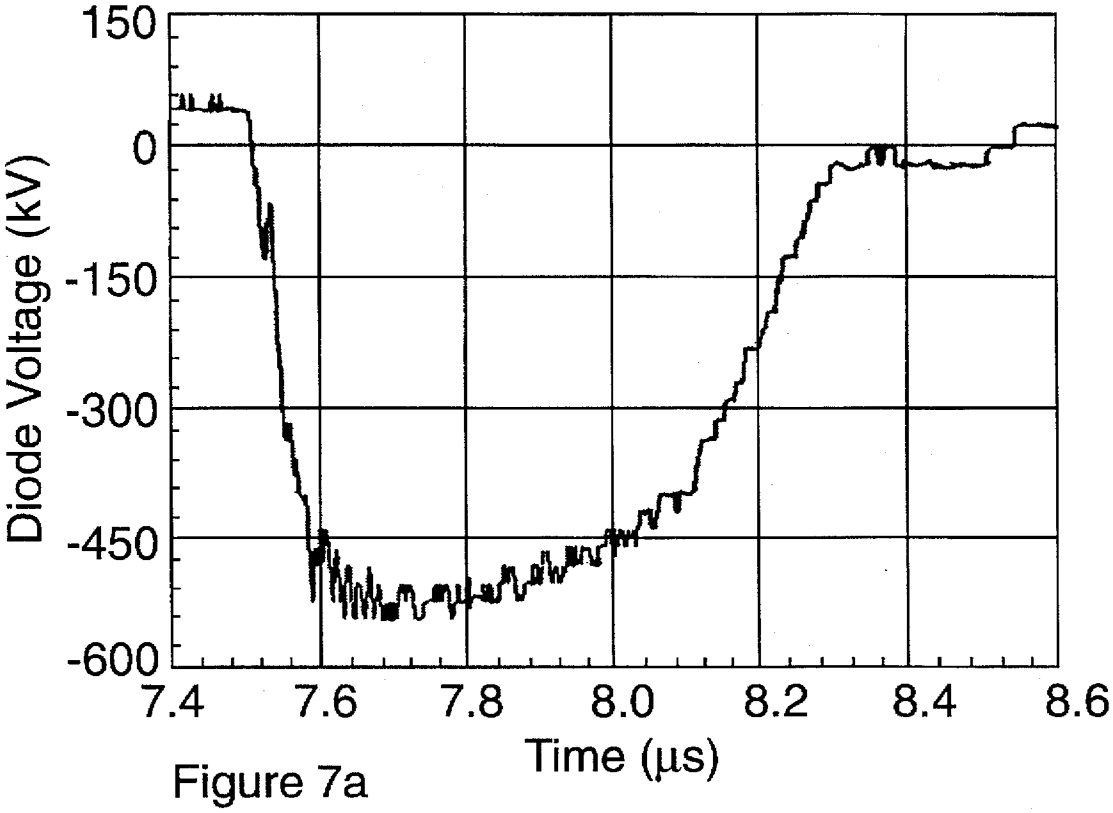
FIGS. 7*a* and 7*b* illustrate experimental data, operating voltage (FIG. 7*a*) and current (FIG. 7*b*) vs. time, for the invention.
Figure 7B:
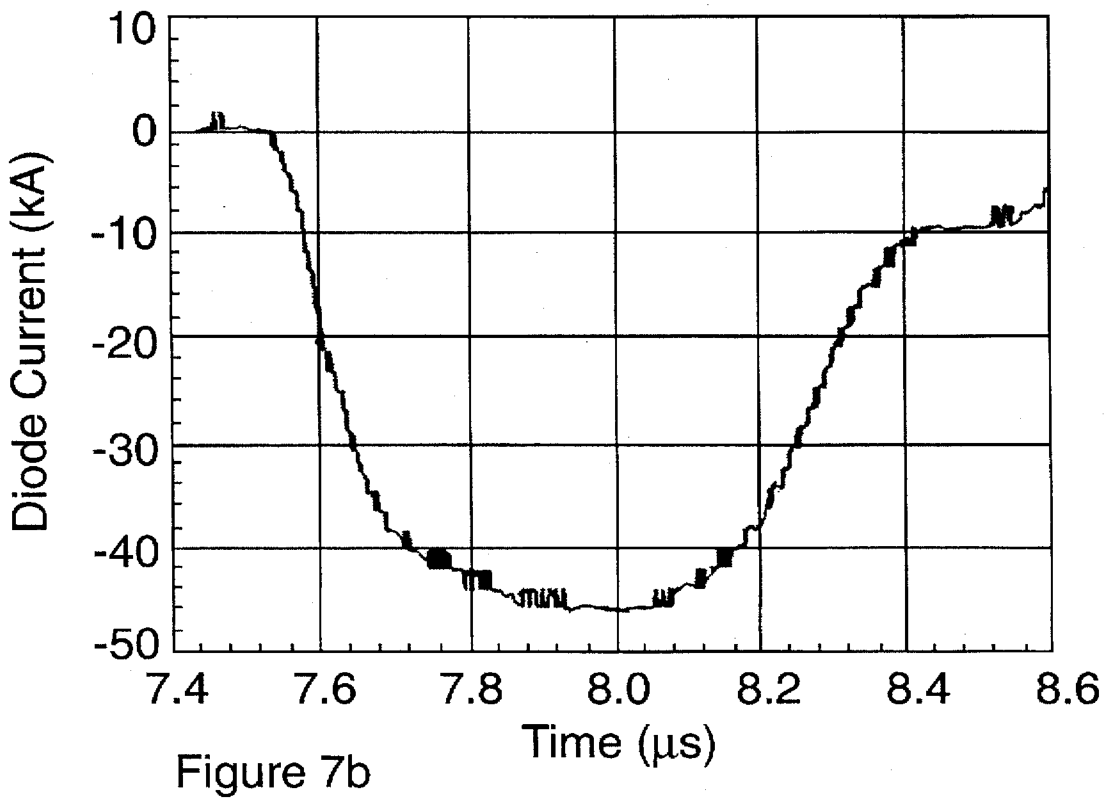
Figure 8A:
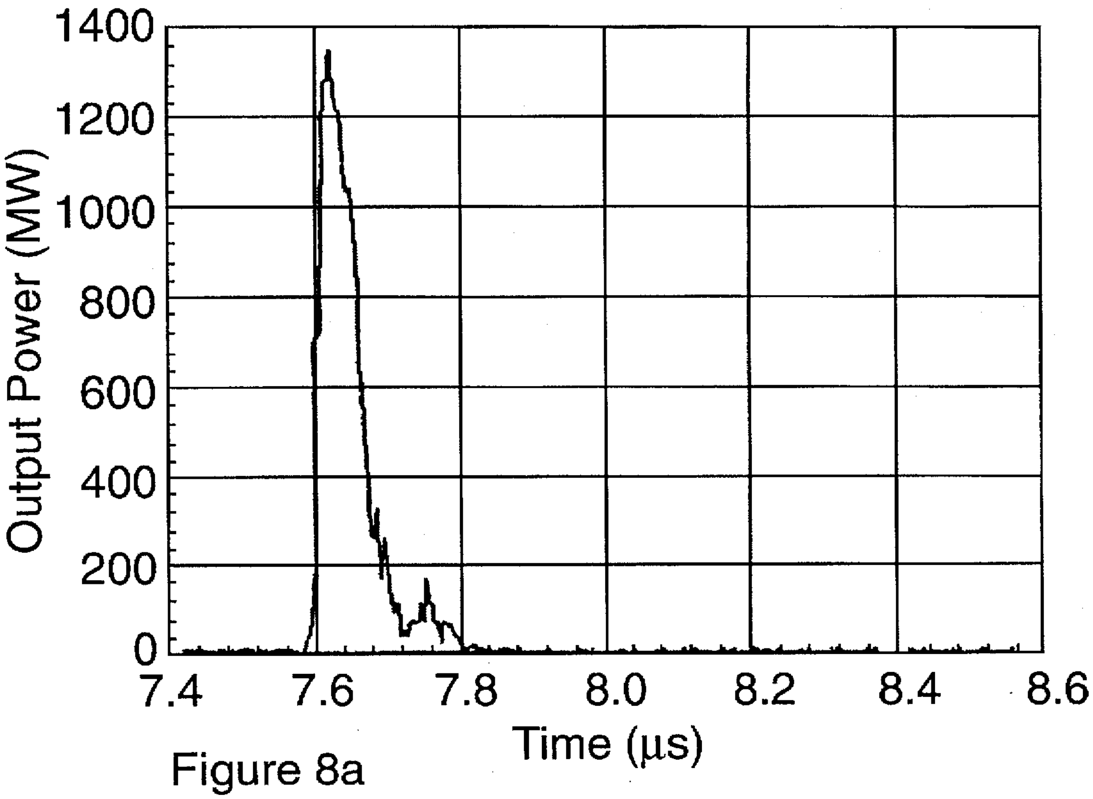
FIGS. 8*a* and 8*b* illustrate experimental data for the invention, output power versus time (FIG. 8*a*) and mixer signal voltage versus time (FIG. 8*b*).
Figure 8B:
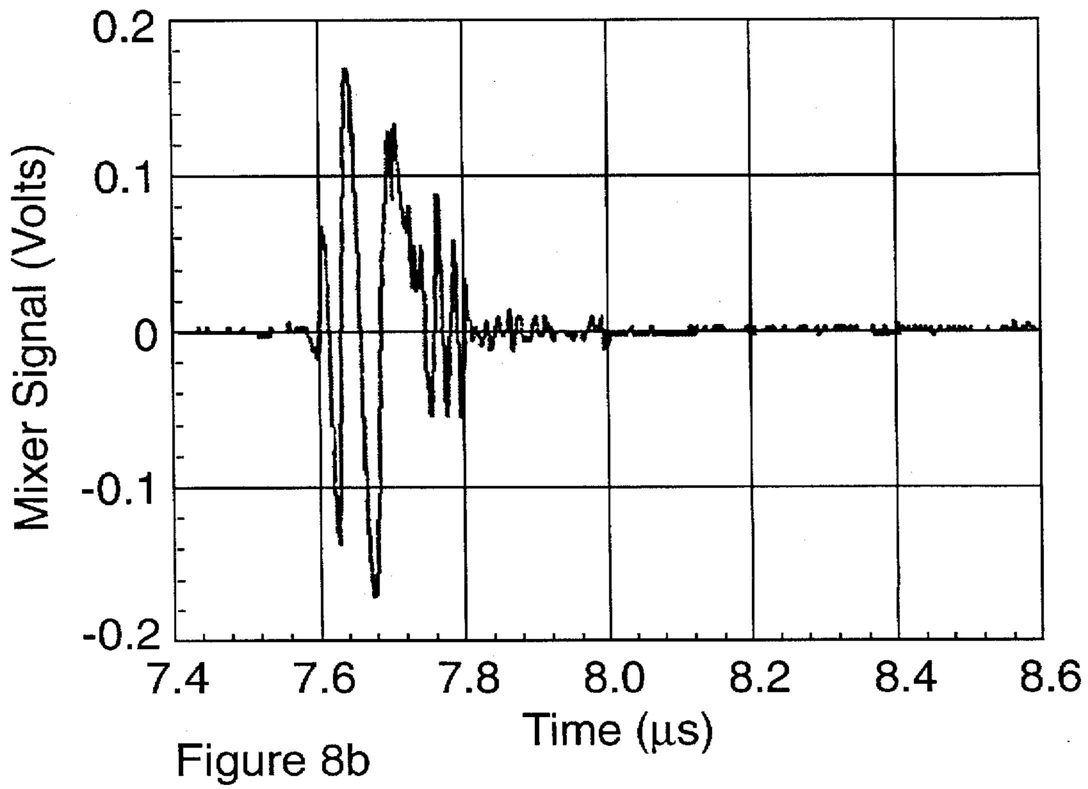

FIGS. 7*a* and 8*b* show corresponding experimental data obtained from one shot of the C4-E MILO. The operating voltage versus time is shown in FIG. 7*a* and current vs. time is shown in FIG. 7*b*. The associated output power versus time is shown in FIG. 8*a* and mixer signal voltage vs. time is shown in FIG. 8*b*. The output power is measured at two different locations: (1) the coaxial transmission line to the antenna, and (2) in the far field regime outside of the tube. Both measurements showed the same power for this shot. FIGS. 7*a* and 8*a* indicate that the peak output power is 1.35 GW for an operating voltage of 510 kV. This is in fair agreement with simulation results. Note that the output power pulse is much shorter than the dc voltage pulse (compare FIGS. 7*a* and 8*a*). This is likely due to plasma formation in the tube, which shorts out the RF. This may explain why the measured output power is lower than that predicted by simulation.

The oscillation frequency is obtained by mixing the signal from a source of known oscillation frequency with the signal from the C4-E MILO. The result of this mixing is shown in FIG. 8*a*, which corresponds to a frequency of 1198 MHz. The latter is given by the sum of the mixer frequency (1180 MHz) and the frequency of the mixed signal. The measured oscillation frequency is also in good agreement with simulation.

Figure 9A:
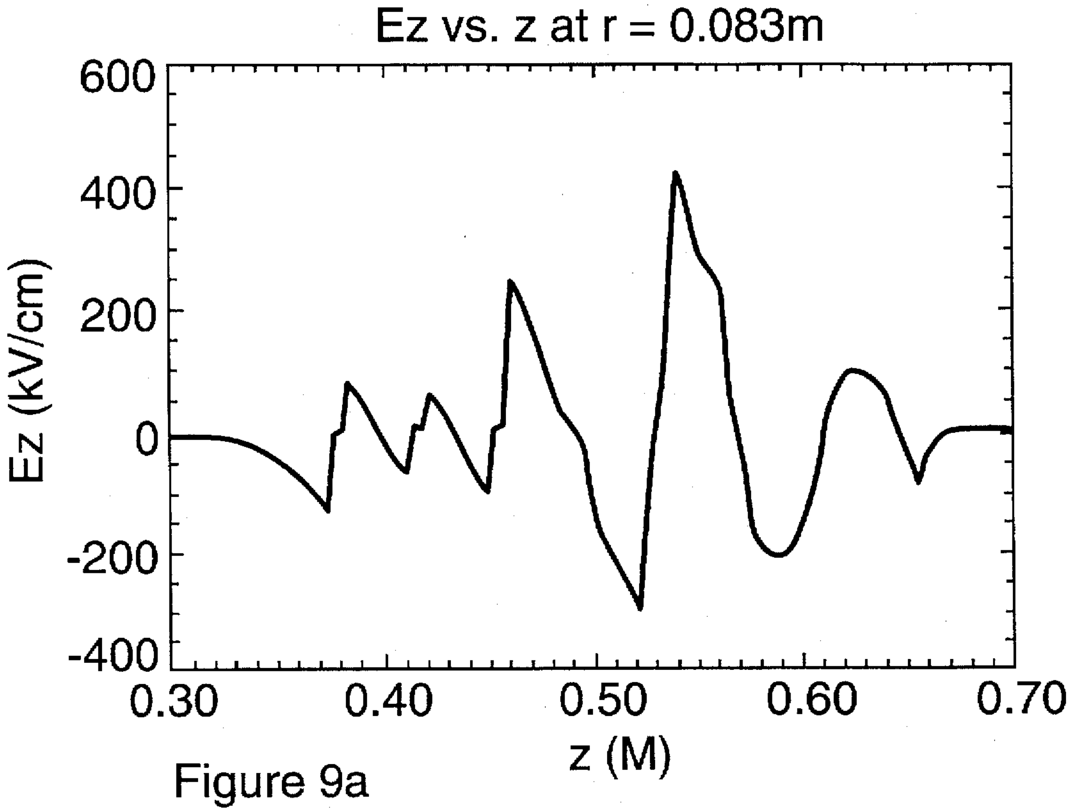
FIGS. 9*a* and 9*b* illustrate a plot of the axial electric field component versus z for the invention in meters (FIG. 9 *a*) and radians (FIG. 9*b*).
Figure 9B:
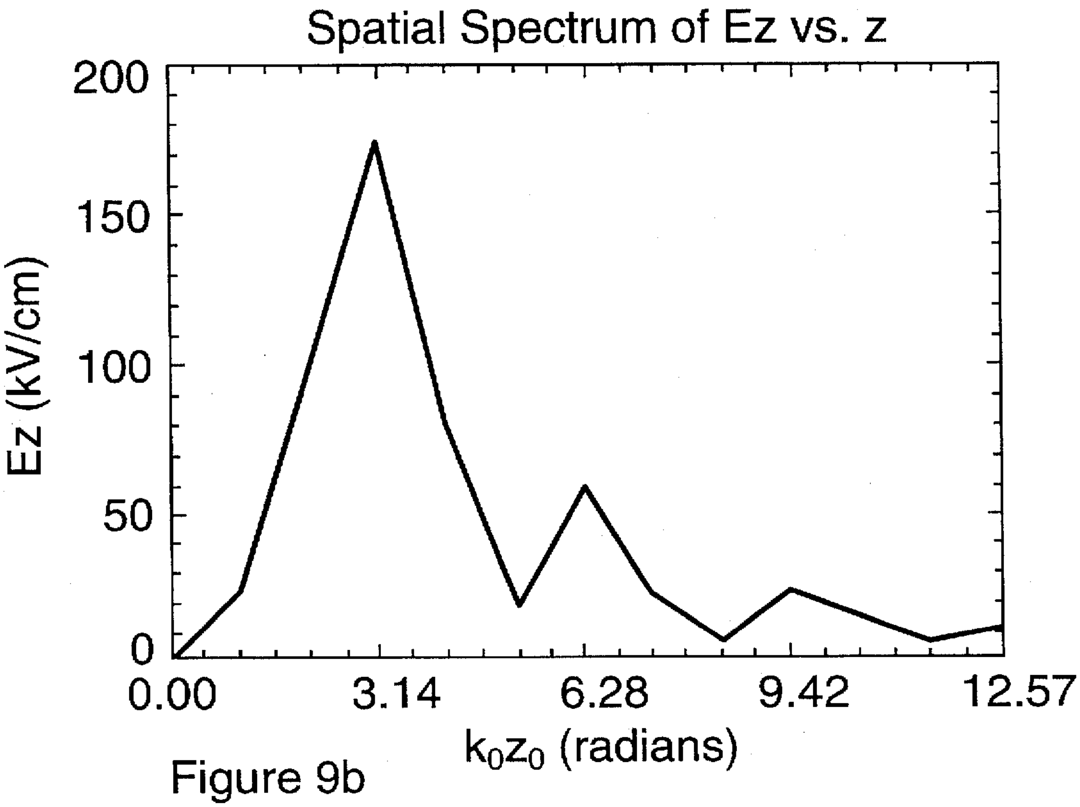

FIG. 9*a*, is a plot of the axial electric field component ($E_z$) versus z. FIG. 9*b*, which is the associated Fourier transform, shows that the tube oscillates in the π mode. Simulations show that this is a direct consequence of using four cavities for the primary SWS portion, as shown in FIG. 5. This mode of operation is the exception to a standard MILO that consists of more than four cavities, and which normally operates in a spatial mode that is comprised of two dominant space harmonics. The electron flow couples more efficiently to the field distribution associated with the π mode compared to that comprised of multiple spatial harmonics. A consequence of this is that for a given input voltage (500 kV) the C4-E MILO requires far fewer cavities (<50% of a standard MILO) to produce high power RF, i.e., over a gigawatt. This gives the C4-E MILO a distinct advantage over prior art MILOs that produce the same output power when tube size is a consideration.

Figure 10:
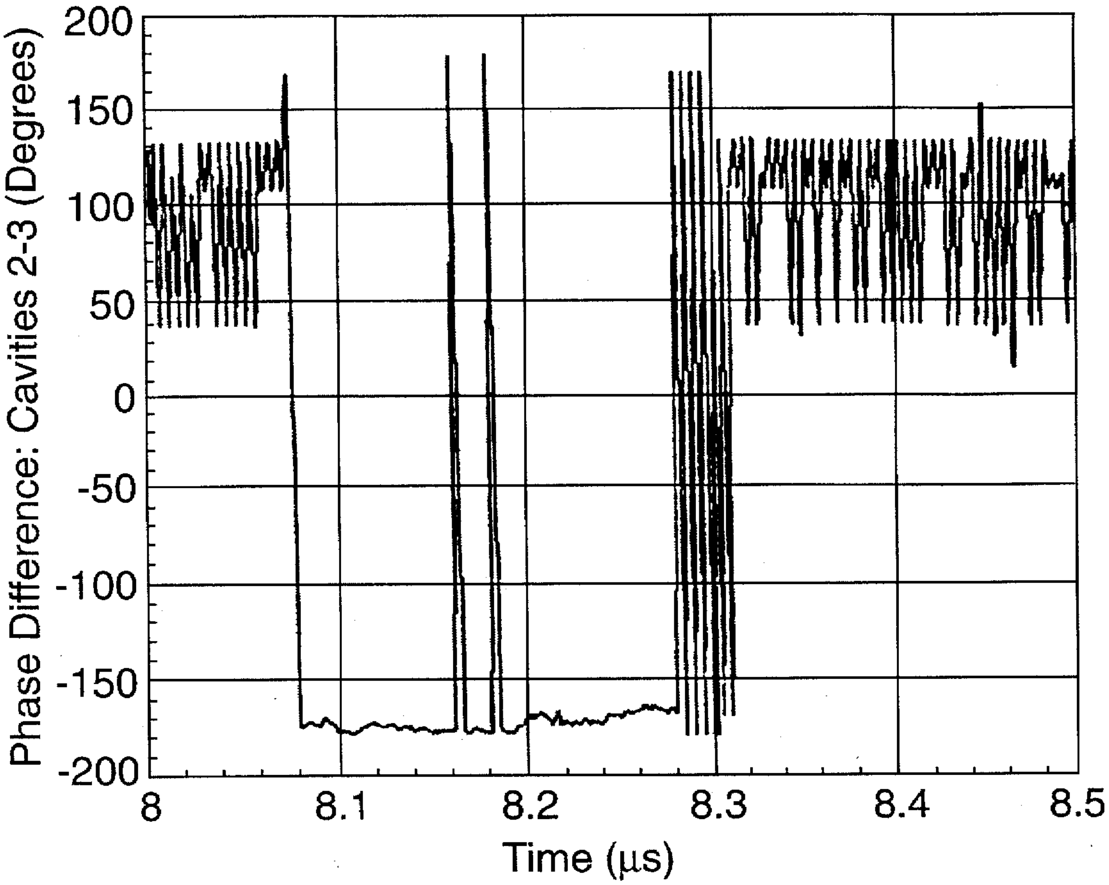
FIG. 10 illustrates the results of an experimental measurement of the oscillation phase for the invention.

FIG. 10 is the result of an experimental measurement of the oscillation phase. The relevant time domain is 8.08 μs to 8.28 μs. The measurement compares the magnetic field in adjacent cavities (the 2nd and 3rd cavities in the primary SWS) to determine the phase difference. The data indicate that the phase difference is −170 to −180 degrees (the sign of the phase difference is not relevant). Note that the phase difference changes to 180 degrees at times which suggests, given the accuracy of measurement, that the phase of oscillation is exactly 180 degrees (π mode).

Figure 11:
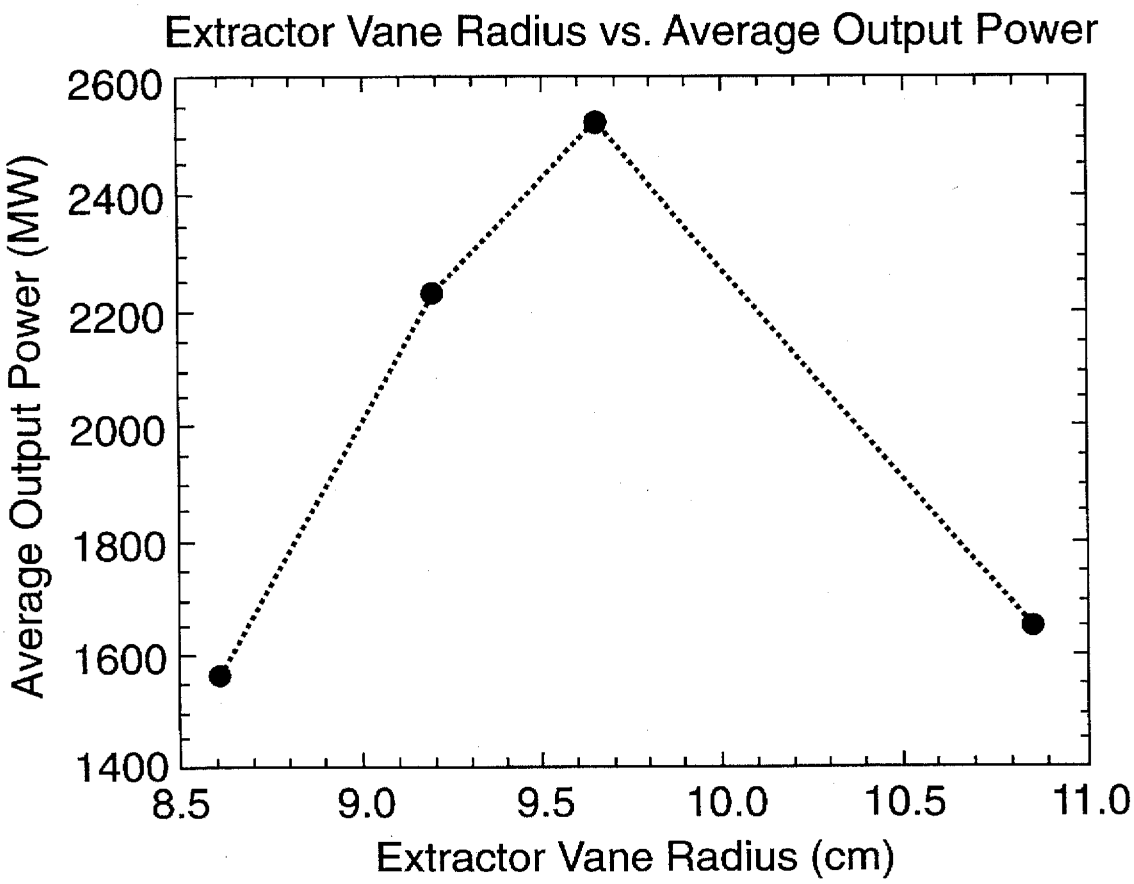
FIG. 11 illustrates the effect on radiated output power for the invention after changing the extractor vane radius.

FIG. 11 shows the effect that changing extractor vane radius (the vane adjacent to the extractor gap) has on radiated output power. Evidently, the radius of the extractor vane must be larger than the rest to achieve maximum power output. However, in contrast to the optimized tube shown in FIG. 3, the vane radius that yields maximum output power is not equal to the outer radius of the beam dump, which was quite thick in the experimental tube. The reason for this difference is related to the fact that the radial component of the RF electric field ($E_r$) is a maximum on the inner radius of the extractor vane. When the radius of the latter is the same as the outer radius of the beam dump, but not too much different than the rest of the primary SWS vanes, the large $E_r$ component on the vane tip is coupled directly to the coaxial line at a radial location where the $E_r$ field associated with the radiated transverse electromagnetic (TEM) wave has a maximum. In this case the extractor impedance is optimum relative to the coaxial transmission line impedance. However, the coupling of the last cavity to the beam and to the adjacent cavity is weakened if the radius of the extractor vane is increased too much relative to the rest. This, in turn, weakens the coupling of the extractor gap to the last cavity of the primary SWS, thereby reducing the RF voltage across the extractor gap, and, consequently, the power radiated to the output coaxial line. This effect is exemplified in FIG. 11.

Figure 12:
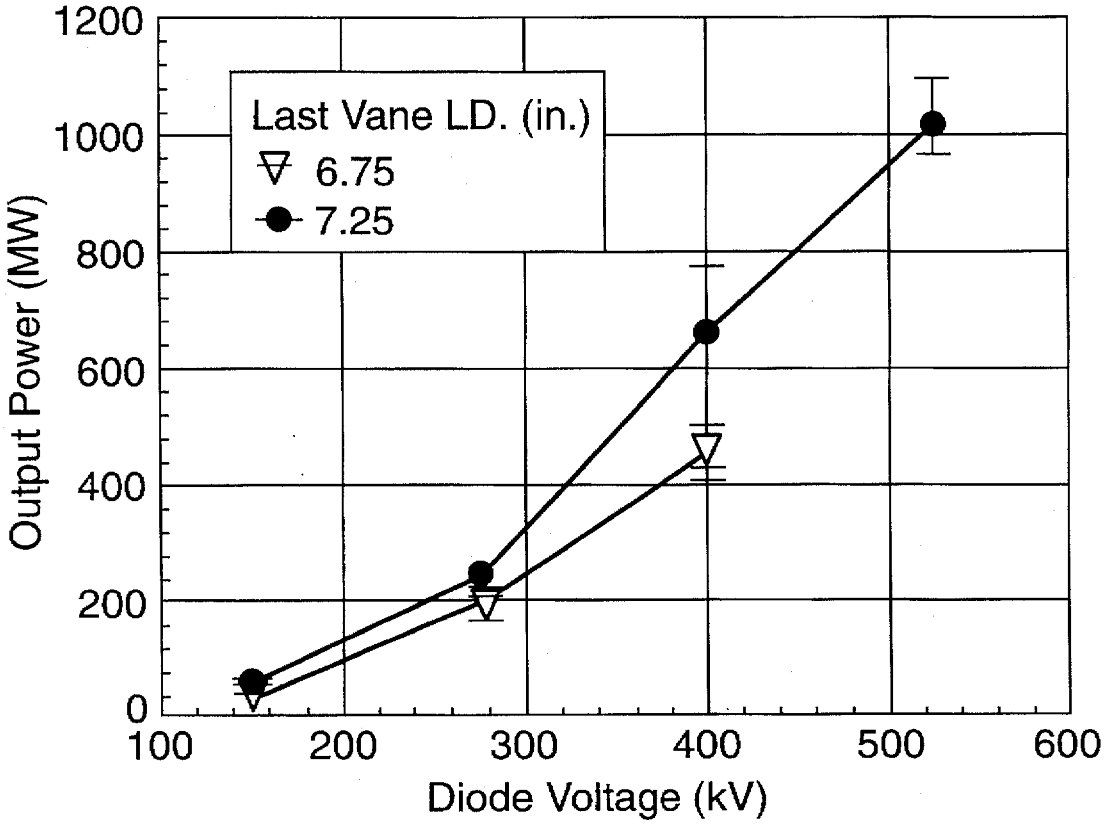
FIG. 12 illustrates a plot of output power vs. operating voltage for two different extractor vane diameters.

FIG. 12 is a plot of output power vs. operating voltage for two different extractor vane diameters (6.75 and 7.25 in.), which was compiled from a number of shots of the C4-E MILO. These vane diameters correspond to the first two points in FIG. 11, 8.6 cm and 9.2 cm, respectively. FIG. 12 shows that at 400 kV the output power increases by 50% when the extractor vane radius is increased relative to the rest of the primary SWS vanes, which verifies the simulation results.

Figure 13A:
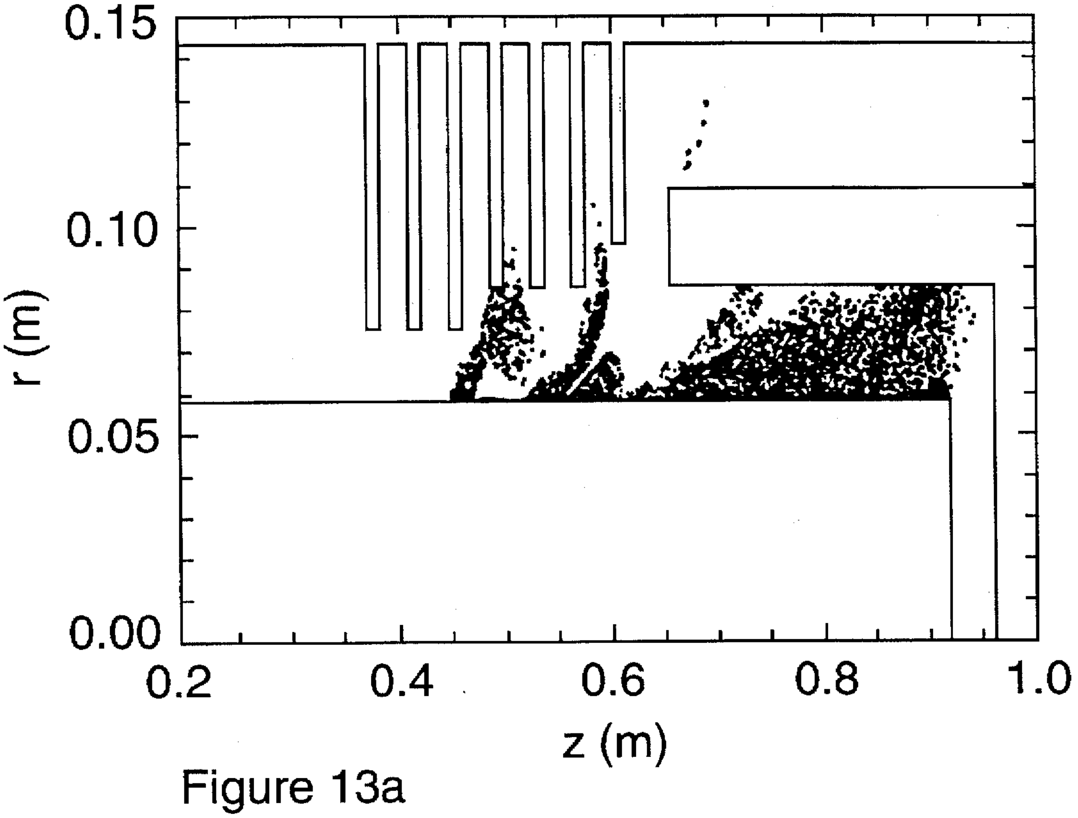
FIGS. 13*a*–17*b* illustrate the results of five simulations for the invention.
Figure 13B:
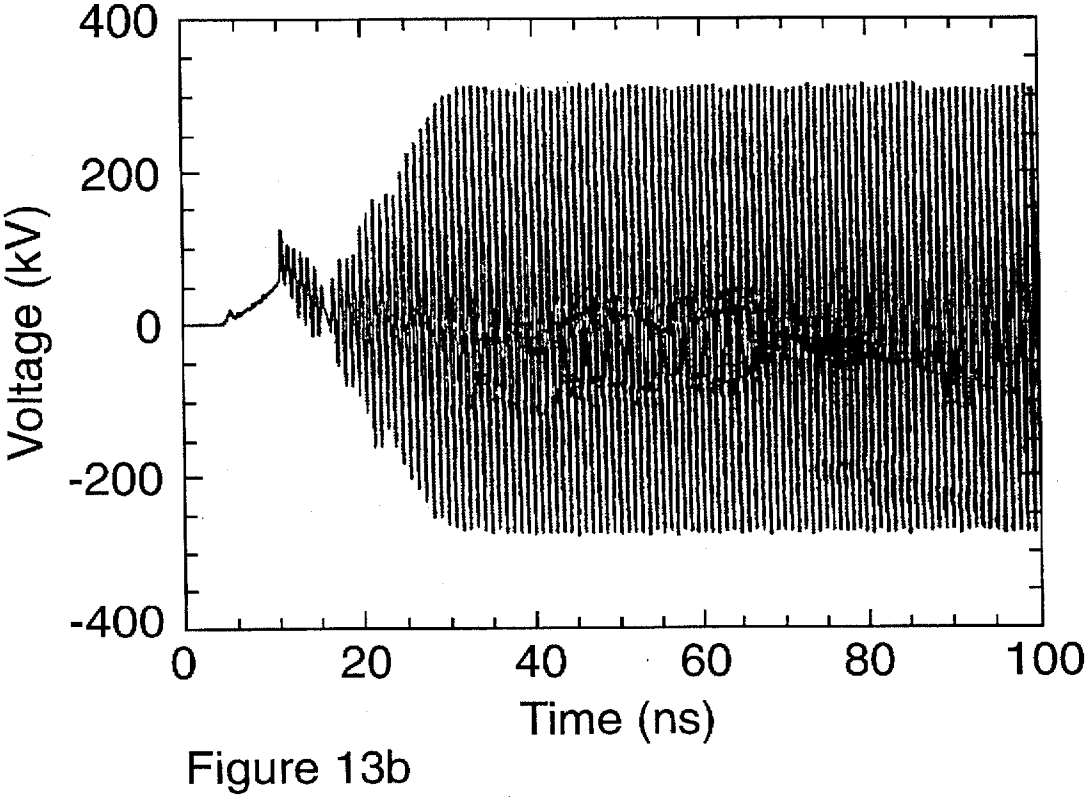

As was mentioned above, the RF choke, beam dump, and location of emission boundaries can have a dramatic effect on the operation of the C4-E MILO. This has been verified theoretically, using particle simulations, and experimentally. Results from five simulations, which are heretofore referred to as cases A0–A4, are depicted in FIGS. 13*a*–17*b*, respectively. In each case the radius of the extractor vane is 9.65 cm (to yield maximum radiated power). Case A0 represents the control, and corresponds to the complete C4-E MILO, the geometry of which is shown in FIG. 13*a*. FIG. 13*b* show the time history of the RF voltage on the output coaxial line.

In cases A1–A4(FIGS. 14*a*–17*b*) the choke vanes have been replaced with vanes identical to those of the primary SWS, thereby eliminating effects associated with the choke. Note also that the cathode radius for these cases is increased by 0.45 cm, to 6.2 cm, in an attempt to maintain the same operating voltage and impedance as in the control.

In case A1 (FIGS. 14*a* –14*b*) the emission region is identical to that in case A0, only the choke has been changed. In cases A2–A4, one or both of the emission boundaries is changed relative to case A1 (compare FIGS. 15*a*–17*a* with FIG. 14*a*). The effect that a given change has on the RF voltage across the output coaxial line is shown in FIGS. 14*b*–17*b*. (Note that the output power is proportional to the square of this quantity (Eq. 2). FIG. 14*b* should be compared to FIG. 13*b*, the coaxial line voltage in the control (A0). FIGS. 15*b*–17*b* should be compared to FIG. 14*b*. The operating voltage, impedance, and average output power for each case are listed in Table I below:

TABLE I

| Case | Operating Voltage (kV) | Operating Impedance (Ω) | Average Radiated Power (MW) |
|---|---|---|---|
| A0 | 502 | 8.6 | 2522 |
| A1 | 504 | 8.7 | 268 |
| A2 | 512 | 9.1 | 0 |
| A3 | 516 | 9.3 | 392 |
| A4 | 505 | 8.8 | 1275 |

Inspection of Table I and a comparison of the corresponding figures shows that the RF choke and the location of the emission boundaries have a substantial effect on the radiated power. Eliminating the effects of the choke (case A1, FIGS. 14*a*–14*b*) reduces the output power by a factor of 9.4. Nevertheless, the tube continues to oscillate in the π mode. Moving the emission boundary so that it coincides with the first vane (case A2, FIGS. 15*a*–15*b*) causes the tube not to oscillate. This suggests that emission under four cavities is a natural condition for driving the π mode.

Figure 16A:
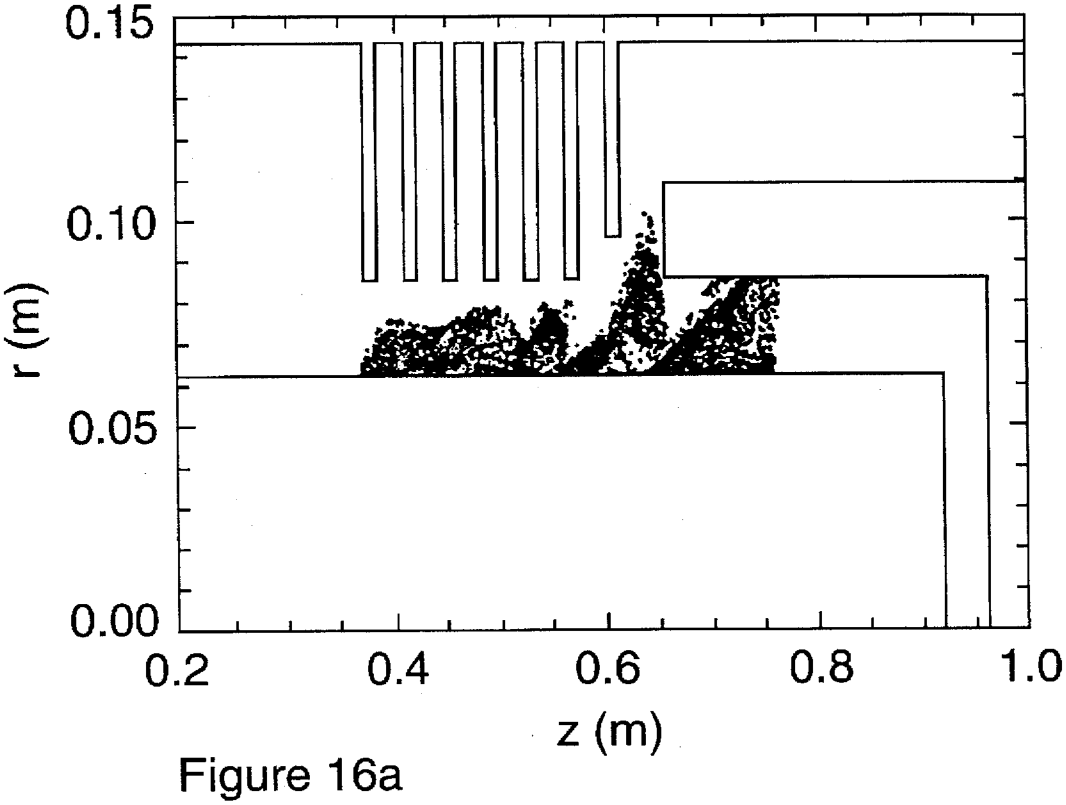
Figure 16B:
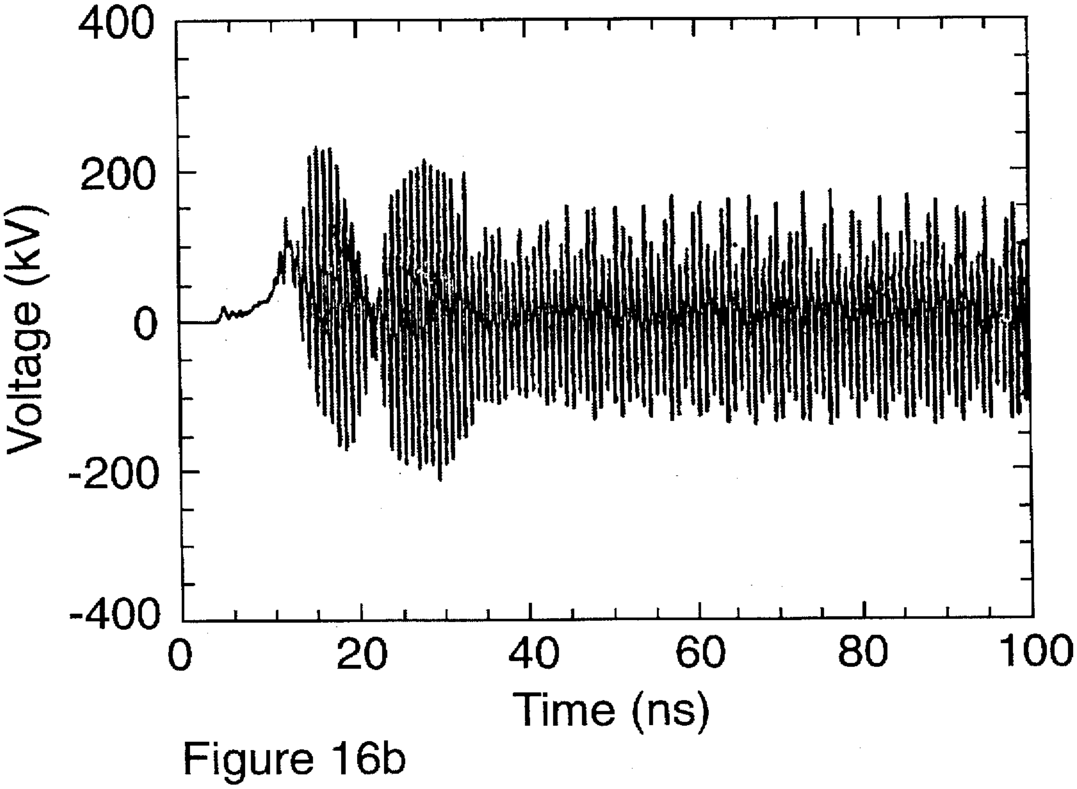

In case A2 (FIGS. 15*a*–15*b*), the preferred mode of oscillation includes propagating spatial harmonics because the tube has more than four cavities (as explained above). The SWS is not long enough to provide sufficient coupling for sustained growth in the preferred mode. This condition is somewhat rectified by adjusting the emission length according to Eq. 1. Case A3 (FIGS. 16*a*–16*b*) corresponds to this configuration. As FIGS. 16*a*–16*b* shows, shortening the emitting region in the beam dump results in sufficient coupling to sustain oscillations, albeit at significantly reduced output power relative to case A0 (see Table 1).

Figure 17A:
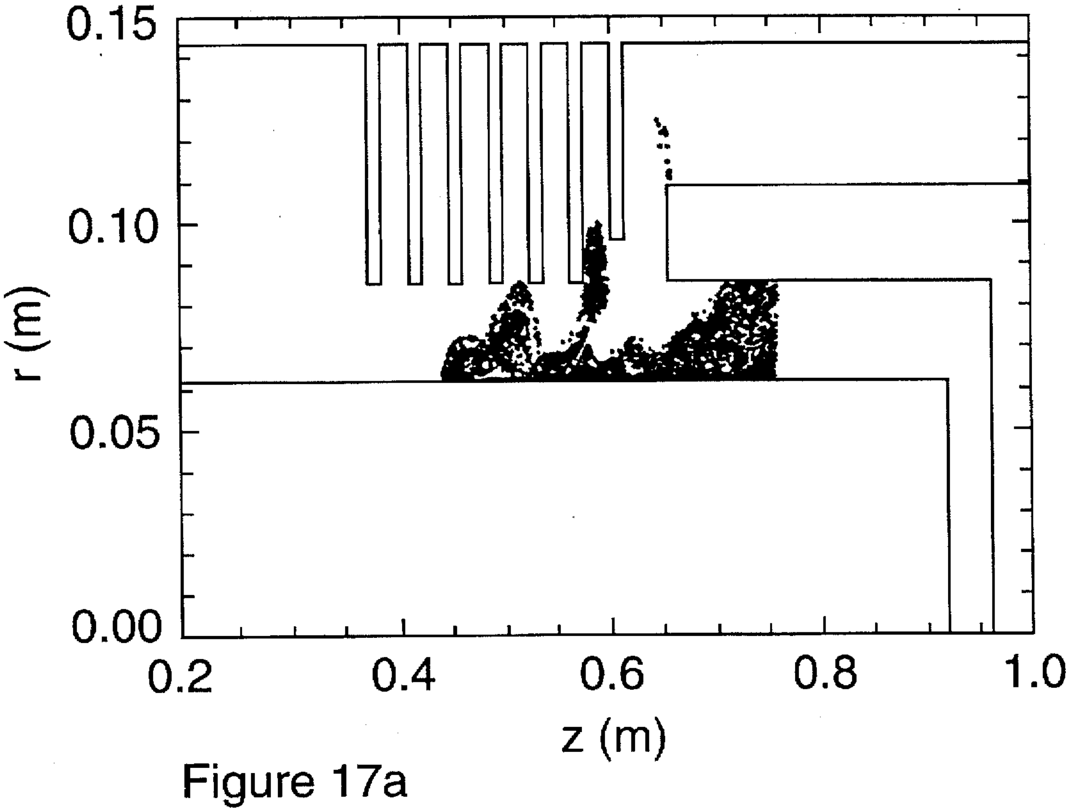
Figure 17B:
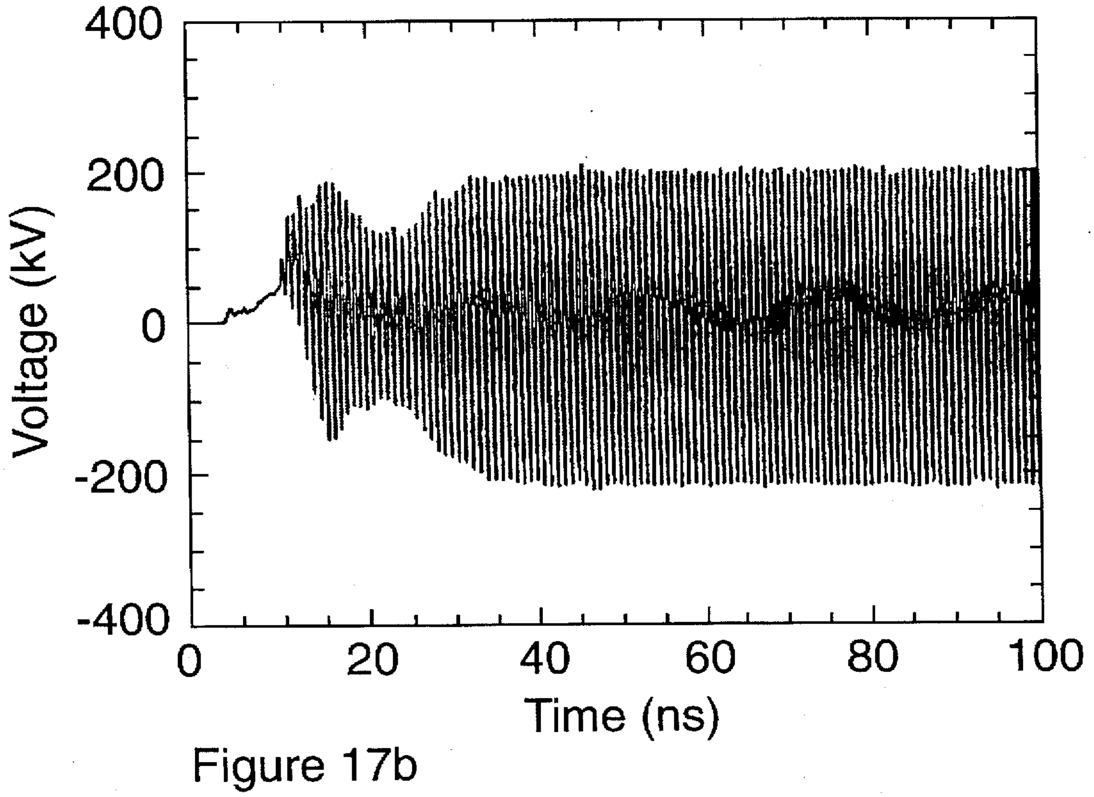

Relocating the upstream emission boundary in case A3 (FIGS. 16*a*–16*b*) so that it coincides with the third vane (as in case A1) recovers π mode operation, which substantially increases the output power. This corresponds to the configuration of case A4, the results of which are shown in FIGS. 17*a*–17*b*. Inspection of Table I shows that the power increased by a factor of 3.25 relative to case A3, but is still a factor of 1.98 lower than in case A0.

Although cases A0 and A4 were run at approximately the same dc voltage and impedance, the only structural difference between these tubes is the choke. The tube with the choke (see FIG. 13*b*) yields twice as much power as the other tube (see FIG. 17*b*). Therefore, in addition to increasing the RF feedback in the interaction region, the presence of the choke may be launching the electron flow in such a way that it is closer to the primary SWS vanes than in configurations without a choke, a result that is caused by the impedance difference between the choke and primary SWS.

Figure 14A:
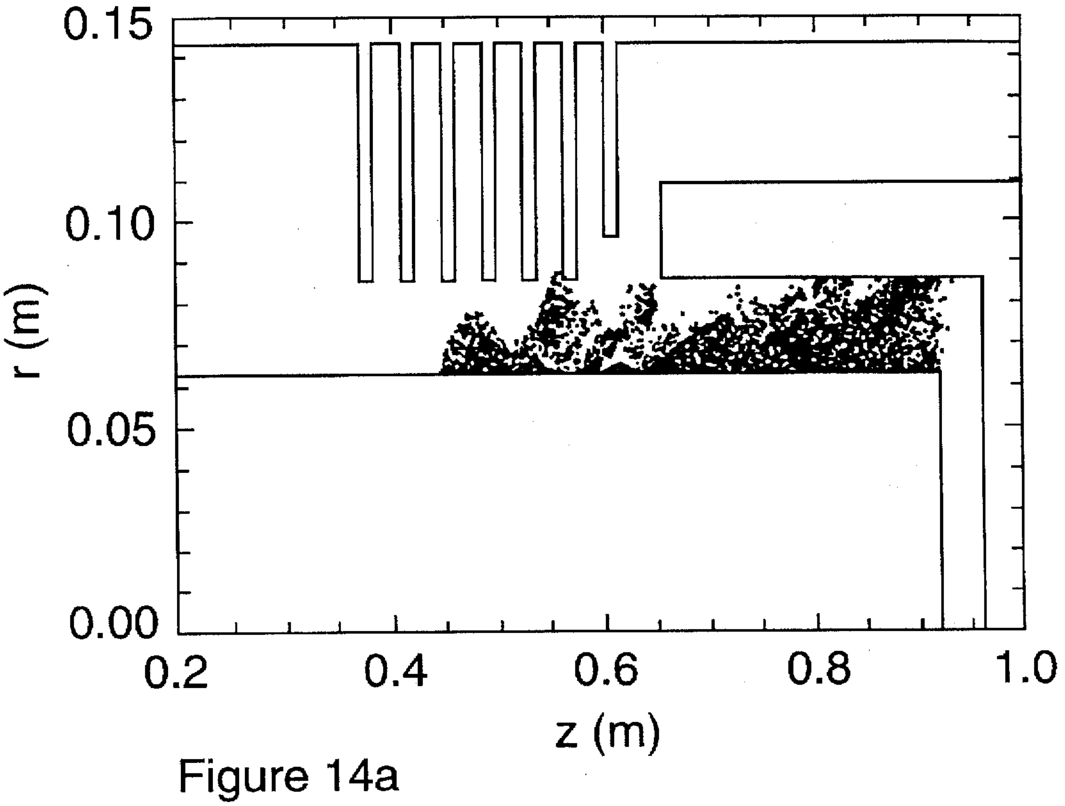
Figure 14B:
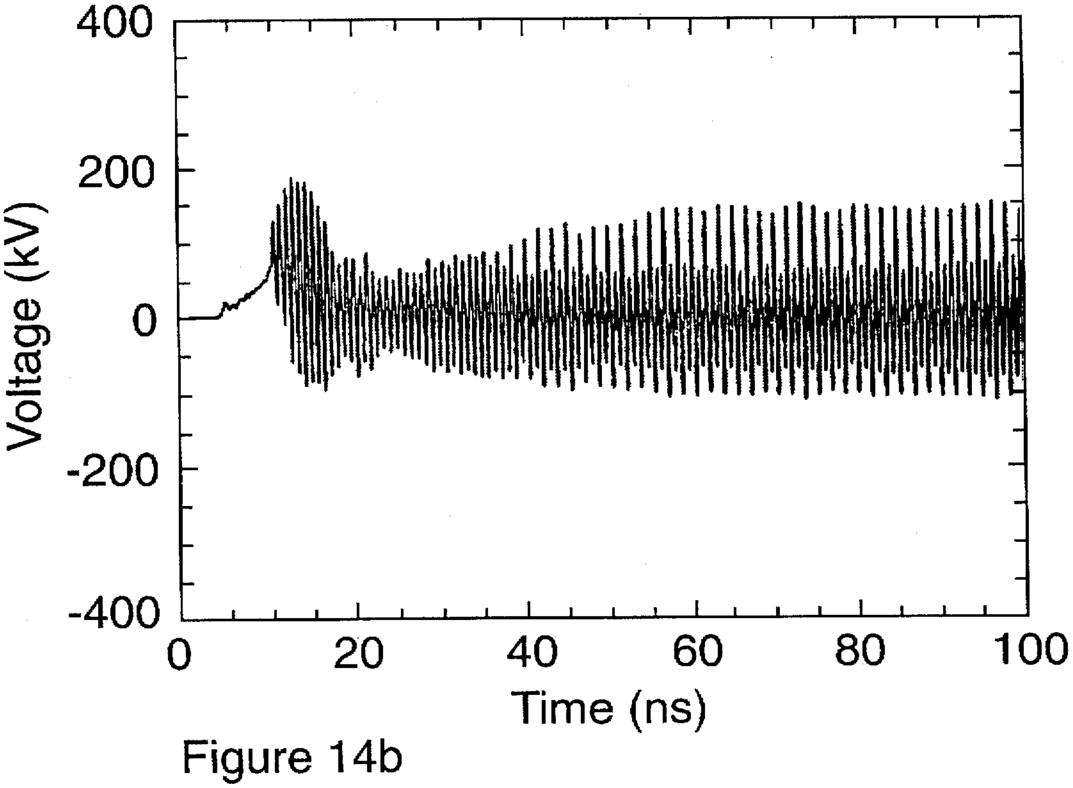
Figure 15A:
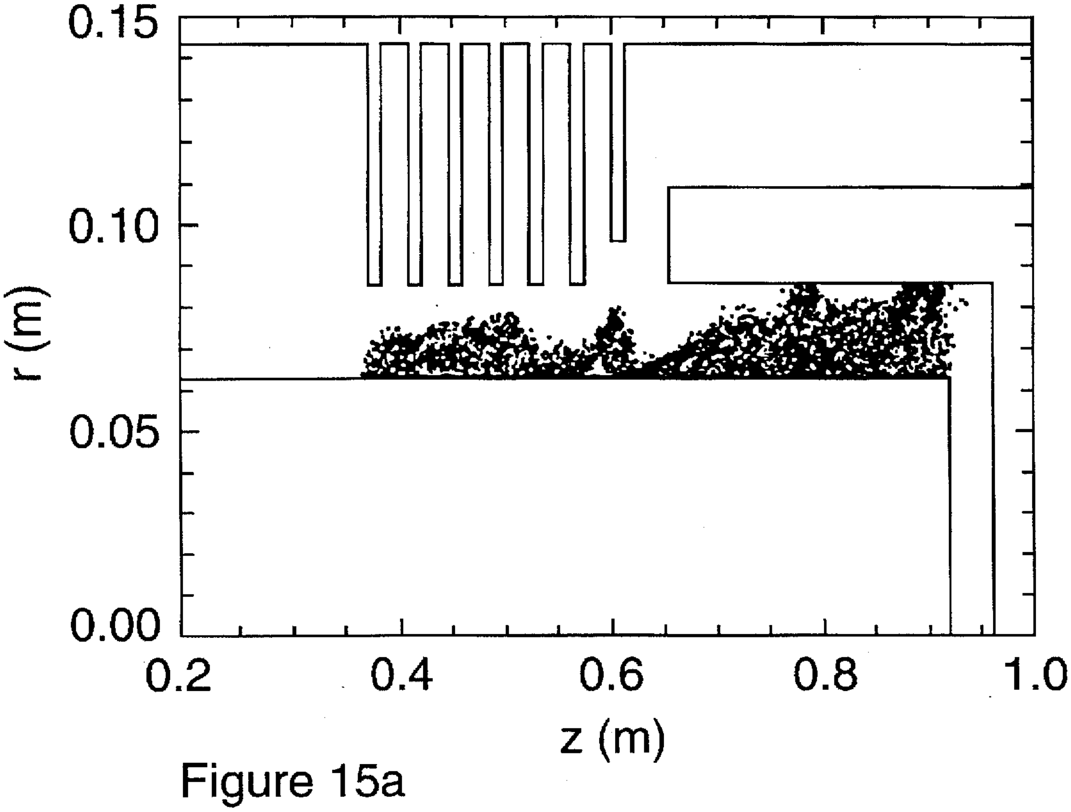
Figure 15B:
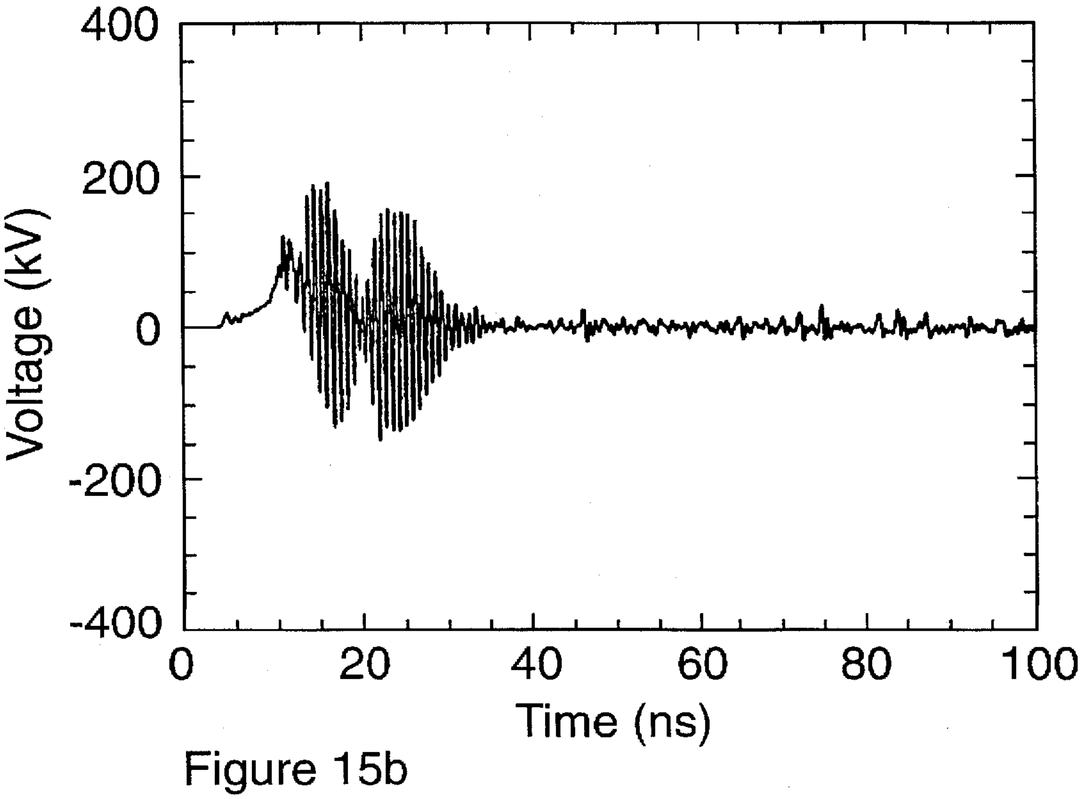
Figure 18:
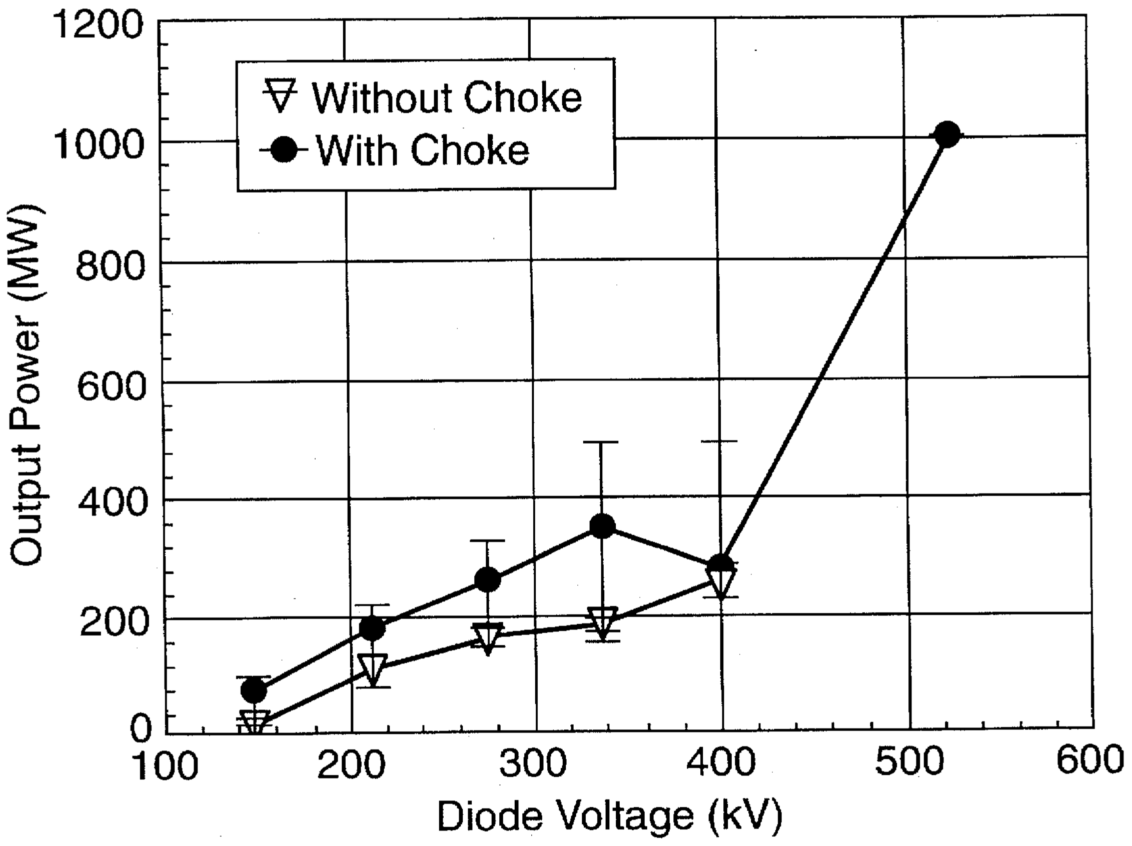
FIG. 18 illustrates a comparison of output power vs. operating voltage for the invention with and without a choke.
Figure 19:
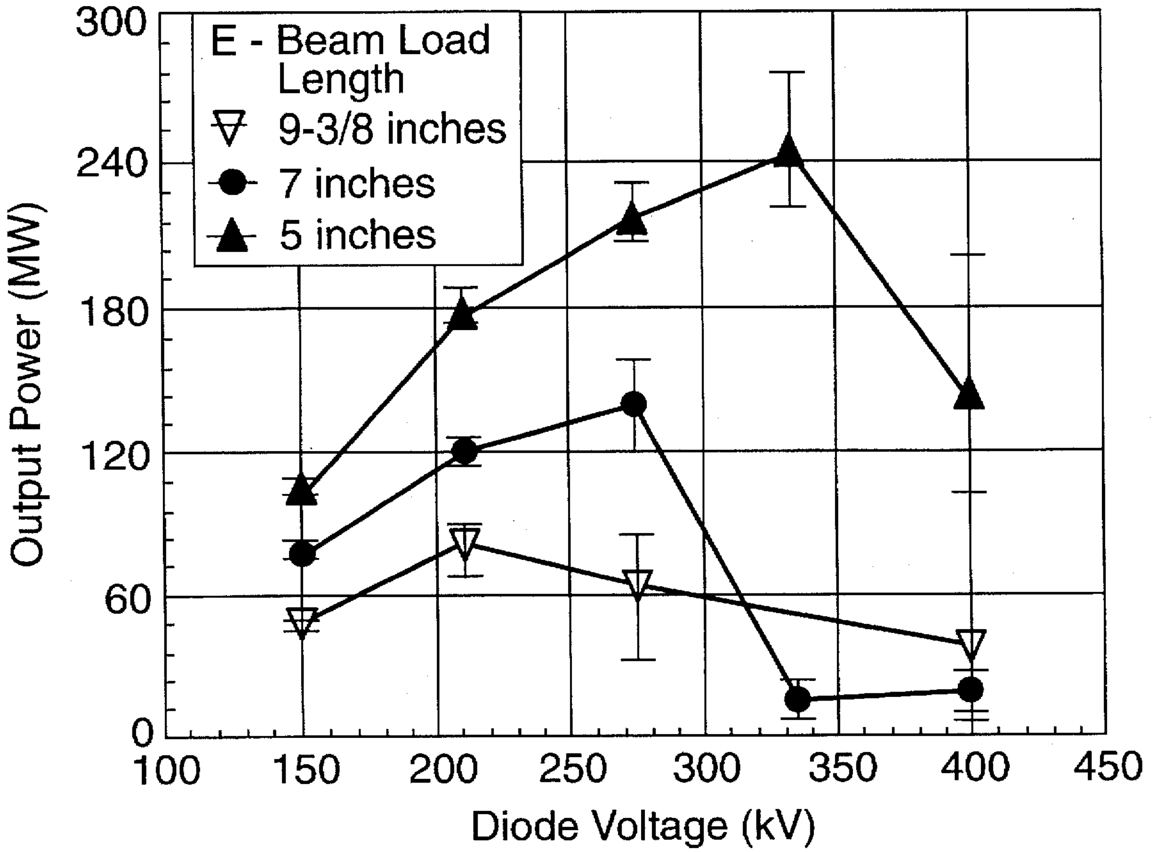
FIG. 19 illustrates a plot of output power vs. operating voltage wherein the cathode length is varied.

FIGS. 18 and 19 show experimental results corresponding to cases A0 (FIGS. 13*a*–13*b*) and A1 (FIGS. 14*a*–14*b*). FIG. 18 is a comparison of output power vs. operating voltage for the C4-E MILO with and without a choke. The data shows that adding the RF choke approximately doubles the output power for voltages up to 340 kV. The result at 400 kV in FIG. 18 is most likely corrupted by plasma formation in the tube, which tends to occur at high voltage. Based on these simulation results it is clear that the result shown for voltages less than 400 kV in FIG. 18 is valid at any voltage.

FIG. 19 is a plot of output power vs. operating voltage for an experimental configuration similar to that used in case A1 (FIGS. 14*a*–14*b*) above. The plot shows the effect that changing the length (L) of the emitting cathode in the beam dump region has on output power. It is clear from the data that making the cathode too long results in a loss of power as explained above.

The SWS configuration employed in case A2 (FIGS. 15*a*–15*b*) is the equivalent of a six cavity MILO with a load region. The above results show that this configuration produces substantially less power than the C4-E MILO, or does not oscillate at all, when it does not include one or more of our proposed modifications. This result holds regardless of the number of cavities comprising the MILO SWS.

The theoretical and experimental investigations of the C4-E MILO, results which have been summarized above, demonstrate that the present invention is superior to previous MILO technology, and represents a significant advance in the technology of self-insulating microwave tubes.

The embodiments specifically disclosed herein were chosen and described in order to best illustrate the principles of the invention and its practical application to thereby enable one of ordinary skill in the art to best utilize the invention in various embodiments and with various modifications as are suited for the particular use contemplated. Other embodiments of the invention will be apparent to those skilled in the art from a consideration of this specification and in practice of the invention disclosed herein. It is intended that the specification and the examples be considered as exemplary only, with the true scope and spirit of the invention being indicated in the following claims.

What is claimed is:

1. A magnetically insulated line oscillator having seven vanes and six cavities formed upon a tube-like structure surrounding a cathode, comprising:

a) a primary slow wave structure comprised of four of said vanes and four of said cavities located near a microwave exit end of said tube-like structure, wherein said primary slow wave structure is a four cavity magnetically insulated line oscillator; and b) an RF choke comprised of three of said vanes and two of said cavities located near a pulsed power source end of said tube-like structure, wherein said RF choke increases feedback in said primary slow wave structure and prevents microwaves generated in said primary slow wave structure from propagating towards said source end.

2. The invention of claim 1 wherein said vanes of said RF choke are comprised of longer vanes than said vanes of said primary slow wave structure, said vanes of said RF choke for preventing microwaves generated in said primary slow wave structure from propagating upstream toward a pulsed power system and returning out of phase within said oscillator.

3. The invention of claim 1, further comprising a beam dump/extractor located at said exit end of said oscillator, said beam dump/extractor for efficiently extracting microwave power from said oscillator.

4. The invention of claim 3 wherein one of said vanes of said primary slow wave structure located nearest said exit comprises an RF extractor vane comprising a larger gap radius than other of said vanes, wherein said RF extractor vane, in conjunction with said beam dump/extractor comprises an RF extractor.

5. The invention of claim 4 wherein uninsulated electron flow is returned downstream along an anode/beam dump region located between said beam dump/extractor and said exit where RF is radiated at said RF extractor vane located near said exit and where said uninsulated electron flow is disposed.

6. The invention of claim 5 further comprising an emitting cathode wherein the length of said emitting cathode is chosen to provide an optimum emission region that endures the strongest coupling of electrons to an RF electric field generated in said primary slow wave structure.

7. A magnetically insulated line oscillator having seven vanes and six cavities formed upon a tube-like structure surrounding a cathode, comprising:

a) a primary slow wave structure comprised of four of said vanes and four of said cavities located near a microwave exit end of said tube-like structure, wherein said primary slow wave structure is a four cavity magnetically insulated line oscillator;

b) an RF choke comprised of three of said vanes and two of said cavities, and located near a pulsed power source end of said tube-like structure, wherein said RF choke increases feedback in said primary slow wave structure, prevents microwaves generated in said primary slow wave structure from propagating towards said source end and modifies downstream electron current so as to enhance microwave power generation;

c) a beam dump/extractor located at said exit end of said oscillator;

d) an RF extractor vane comprising a vane of said primary slow wave structure located near said exit which comprises a larger gap radius than other of said vanes of said primary slow wave structure, wherein said RF extractor vane, in conjunction with said beam dump/extractor comprises an RF extractor where RF is radiated; and e) an anode/beam dump region located between said beam dump/extractor and said exit wherein uninsulated electron flow is returned downstream towards said exit along said anode/beam dump region and said uninsulated electron flow is disposed.

8. The invention of claim 7, further comprising; a cathode having a length that extends into said anode/beam dump region.

9. A magnetically insulated line oscillator having seven vanes and six cavities formed upon a tube-like structure surrounding a cathode, comprising a) a primary slow wave structure comprised of four of said vanes and four of said cavities located near a microwave exit end of said tube-like structure, wherein said primary slow wave structure is a four cavity magnetically insulated line oscillator, and wherein the vane located closest to said exit also comprises an RF extractor vane which has a larger gap radius than other of said vanes of said slow wave structure;

b) an RF choke comprised of three of said vanes and two of said cavities, and located near a pulsed power source end of said tube-like structure, wherein said RF choke increases feedback in said primary slow wave structure and prevents microwaves generated in said primary slow wave structure from propagating towards said source end of said tube-like structure;

c) a beam dump/extractor located at said exit end of said oscillator, said beam dump/extractor for extracting microwave power from said oscillator, wherein said RF extractor vane, in conjunction with said beam dump/extractor comprises an RF extractor;

d) an anode/beam dump region located between said beam dump/extractor and said exit wherein uninsulated electron flow is returned downstream towards said exit along said anode/beam dump region where uninsulated electron flow is disposed; and e) a cathode having a length that extends into said anode/beam dump region.

* * * * *